US009627066B1

(12) United States Patent
Pasotti et al.

(10) Patent No.: US 9,627,066 B1
(45) Date of Patent: Apr. 18, 2017

(54) NON VOLATILE MEMORY CELL AND MEMORY ARRAY

(71) Applicant: STMicroelectronics S.r.l., Agrate Brianza (MB) (IT)

(72) Inventors: Marco Pasotti, Travaco' Siccomario (IT); Fabio de Santis, Milan (IT); Roberto Bregoli, Offlaga (IT); Dario Livornesi, Paderno Dugnano (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/210,709

(22) Filed: Jul. 14, 2016

(51) Int. Cl.
*G11C 16/04* (2006.01)
*G11C 16/26* (2006.01)
*G11C 16/10* (2006.01)
*G11C 16/14* (2006.01)

(52) U.S. Cl.
CPC .......... *G11C 16/0441* (2013.01); *G11C 16/04* (2013.01); *G11C 16/0408* (2013.01); *G11C 16/10* (2013.01); *G11C 16/14* (2013.01); *G11C 16/26* (2013.01)

(58) Field of Classification Search
CPC ......... G11C 16/04; G11C 16/10; G11C 16/14; G11C 16/26; G11C 16/0483; G11C 16/0408; G11C 16/0433
USPC .............. 365/185.1, 185.05, 185.18, 185.24, 365/185.27, 185.29
See application file for complete search history.

(56) References Cited

U.S. PATENT DOCUMENTS

| 6,876,033 B2 | 4/2005 | Cappelletti et al. |
| 7,626,864 B2 * | 12/2009 | Wang .................... H01L 27/115 257/315 |
| 8,619,469 B2 * | 12/2013 | Pasotti ............... G11C 16/0433 365/185.1 |

(Continued)

OTHER PUBLICATIONS

Choi, K., "NAND Flash memory," Samsung Electronics, Co., Ltd., Flash design team, May 7, 2010, 48 pages.

(Continued)

*Primary Examiner* — Gene Auduong
(74) *Attorney, Agent, or Firm* — Slater Matsil, LLP

(57) ABSTRACT

A non-volatile memory cell for storing a single bit is disclosed. The non-volatile memory cell includes an access transistor including a gate, a first body, a first source/drain node, and a second source/drain node. The non-volatile memory cell also includes a first floating gate storage transistor that has a third source/drain node, a second body, a fourth source/drain node, and a first floating gate including a first storage node. The third source/drain node is coupled to the second source/drain node. The non-volatile memory cell further includes a first capacitor, a second capacitor, and a second floating gate storage transistor. The first capacitor has a first plate coupled to the first storage node and an opposite second plate. The second floating gate storage transistor includes a fifth source/drain node, a third body, a sixth source/drain node, a second floating gate including a second storage node. The fifth source/drain node is coupled to the fourth source/drain node. The second capacitor includes a third plate coupled to the second storage node and having an opposite fourth plate. The second plate is coupled to the fourth plate, and the first body of the access transistor is coupled to the second body and the third body.

30 Claims, 17 Drawing Sheets

THIS IS n Mc NAND cell
ARRAY Similar to the
prior patent 8,693,256

(56) References Cited

U.S. PATENT DOCUMENTS 8,693,256 B2 * 4/2014 Pasotti ............... G11C 16/0433
　　　　　　　　　　　　　　　　　　　　　　365/185.05
9,361,982 B2 * 6/2016 Milani ............... G11C 16/0408

OTHER PUBLICATIONS

Crippa, L., et al. "Nonvolatile Memories: NOR vs. NAND Architectures," Memories in Wireless Systems, 2008, pp. 29-53.
"NAND Flash 101: An Introduction to NAND Flash and How to Design It in to Your Next Product," Technical Note, Micron, 2006, pp. 1-27.

* cited by examiner

THIS IS n Mc NAND cell
ARRAY Similar to the
prior patent 8,693,256

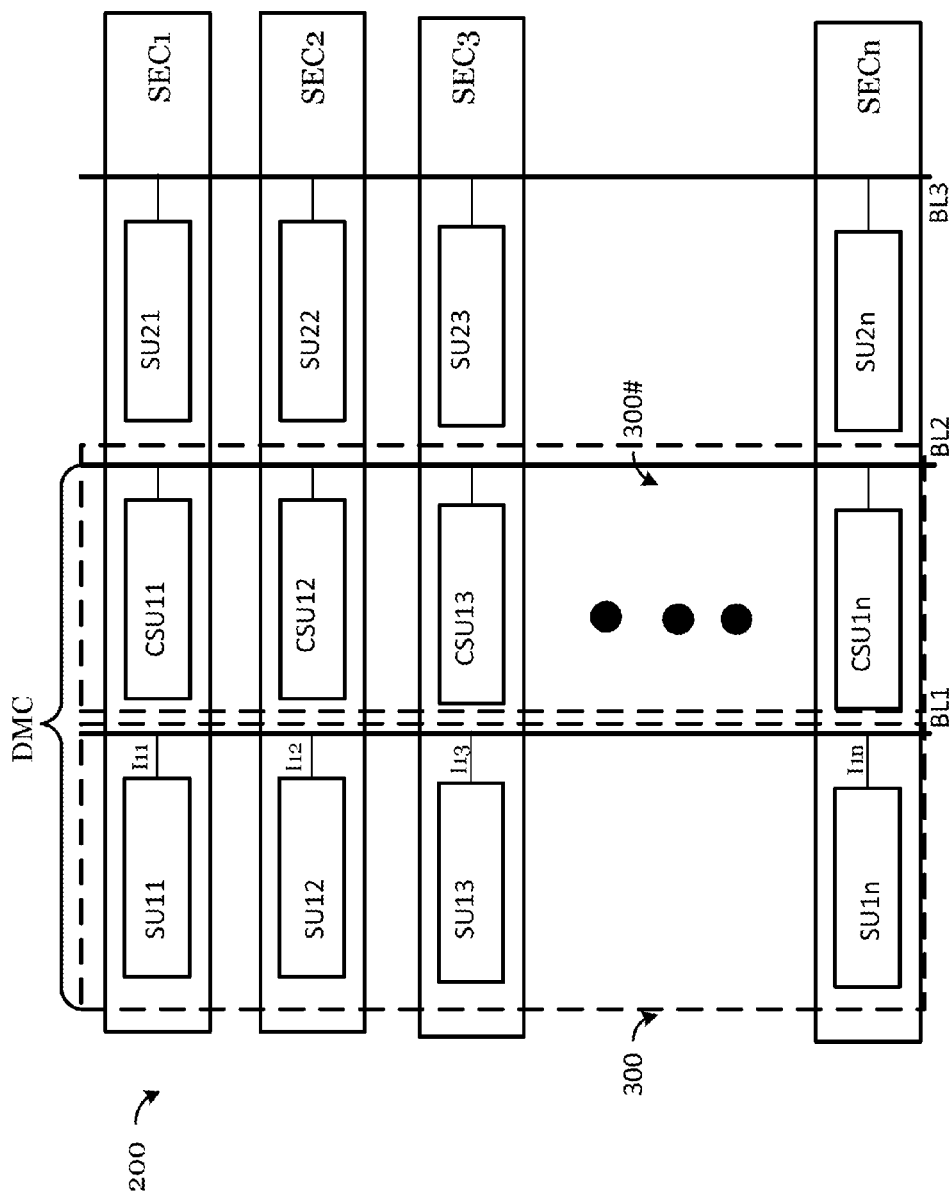

NON VOLATILE MEMORY CELL AND MEMORY ARRAY

TECHNICAL FIELD

The present invention relates generally to semiconductor devices, and, in particular embodiments, to non-volatile memory cell and memory array.

BACKGROUND

Non-volatile memory devices are used in applications requiring the storing of information that has to be retained even when the memory devices are not powered. Generally, each memory device includes a matrix of memory cells based on floating gate MOS storage transistors. Each storage transistor has a threshold voltage that may be set (according to an electric charge in its floating gate) to different levels representing corresponding logic values. For example, in Electrical Erasable and Programmable Read-Only Memories (EEPROMs), each storage transistor may be both programmed (by injecting electric charge into its floating gate) and erased (by removing electric charge from its floating gate) individually. A set of MOS selection transistors applies the required voltages selectively to the corresponding storage transistor (with a quite complex structure that limits the capacity of the EEPROMs to a few Kbytes). On the other hand, flash memories have a simple structure that allows obtaining very high capacities thereof, up to some Gbytes. The memory cells are grouped in sectors where each cell is integrated in a common well of semiconductor material without any selection transistor (with the need of erasing the flash memories at the sector level).

In both cases, a production process of the memory devices substantially differs from a standard one (for example, in CMOS-technology). Indeed, the storage transistors may require an additional polysilicon layer to define their floating gates (besides the one used to define their control gates as in the CMOSs). This difference may add design complexity, which may significantly increase the manufacturing cost of the memory devices (of the order of 30% with respect to standard CMOS devices).

Single poly EEPROM, also referred sometimes a few time programmable FTP memories, have been proposed in the last years that overcome some of these issues. In single poly memories, the memory cells are again grouped in sectors (integrated in corresponding wells). However, the storage transistor of each memory cell now has a distinct control gate region being capacitively coupled with its floating gate. Therefore, the FTP memories use a single polysilicon layer, so that they may be manufactured with the standard CMOS production process.

However, such processes and designs typically result in poor reliability. In order to target a higher level of reliability in non-volatile memory design, differential cell design may be used. However such designs are not sufficient by themselves. Therefore, additional checks on logic data, for example, a CRC code or a more effective Error Correction Code ECC (SEC/SED) can been added. CRC inserts a certain level of improvement with respect to a standard differential mode, and in any case is typically poor and increases the memory area significantly.

On the other hand, an ECC approach requires different levels of customization and therefore impacts memory architecture. ECC code is typically stored in spare area requiring extra storage space. Specifically, ECC impacts the digital block memory area because of specific algorithms that have to be implemented. ECC also results in poorer performance (e.g., access time) because of data post processing at digital level. For example, during a programming operation, the ECC unit calculates the ECC code based on the data stored in the sector. The ECC code for the data area is then written to the corresponding spare area. When the data is read out, the ECC code is also read out, and the reverse operation is applied to check that the data is correct. It is possible for the ECC algorithm to correct data errors. The number of data errors that can be corrected depends on the correction strength of the algorithm used.

In particular, because of the slower access times and the specific algorithms that have to be implemented, typically ECC cannot be implemented in small memory IPs because complex digital Nock for data managing may be required that could be not compatible with the simple and area effective target of small memories, which typically are serial memories with few gates for internal state machine to manage basic operations.

SUMMARY

In accordance with an embodiment of the present invention, a non-volatile memory cell for storing a single bit is disclosed. The non-volatile memory cell includes an access transistor including a gate, a first body, a first source/drain node, and a second source/drain node. The non-volatile memory cell also includes a first floating gate storage transistor including a third source/drain node, a second body, a fourth source/drain node, and a first floating gate including a first storage node. The third source/drain node is coupled to the second source/drain node. The non-volatile memory cell further includes a first capacitor, a second capacitor, and a second floating gate storage transistor. The first capacitor has a first plate coupled to the first storage node and an opposite second plate. The second floating gate storage transistor includes a fifth source/drain node, a third body, a sixth source/drain node, a second floating gate including a second storage node. The fifth source/drain node is coupled to the fourth source/drain node. The second capacitor includes a third plate coupled to the second storage node and having an opposite fourth plate. The second plate is coupled to the fourth plate, and the first body of the access transistor is coupled to the second body and the third body.

In accordance with an alternative embodiment of the present invention, a memory cell array includes a plurality of sectors arranged in rows. Each sector includes columns of differential memory cells, and each of the differential memory cells has a storage cell and a complementary storage cell. The storage cell is configured to be read through a bit line, where the storage cell includes a first storage unit having a first storage node and a second storage unit having a second storage node. The first storage unit is coupled in series with the second storage unit and coupled to the bit line. The first storage node and the second storage node are configured to store the same value. The complementary storage cell is configured to be read through a complementary bit line, where the complementary storage cell includes a first complementary storage unit having a third storage node and a second complementary storage unit having a fourth storage node. The first complementary storage unit is coupled in series with the second complementary storage unit and coupled to the complementary bit line. The first complementary storage unit and the second complementary storage unit are configured to store the same value that is opposite in phase to the value stored in the first and the second storage units.

In accordance with an alternative embodiment of the present invention, a memory cell array includes a plurality of sectors arranged in rows, where each sector includes columns of differential memory cells, and each of the differential memory cells include a first storage cell in a first sector, a first complementary storage cell in the first sector, a second storage cell in a second sector, and a second complementary storage cell in the second sector. The first storage cell and the second storage cell are configured to be read simultaneously through a bit line. The first storage cell includes a first storage unit including a first storage node, and the second storage cell includes a second storage unit including a second storage node. The first storage node and the second storage node are configured to store the same value. The first complementary storage cell and the second complementary storage cell are configured to be read simultaneously through a complementary bit line. The first complementary storage cell includes a first complementary storage unit including a third storage node, and the second complementary storage cell includes a second complementary storage unit including a fourth storage node. The first complementary storage unit and the second complementary storage unit are configured to store the same value that is opposite in phase to the value stored in the first and the second storage units.

In accordance with an alternative embodiment of the present invention, a memory cell array includes a first line, a second line, a first access control line, a first word line, a body line, a first non-volatile memory cell storing a first single bit, first plurality of storage transistors in series. The first non-volatile memory cell includes a first access transistor including a gate coupled to the first access control line, a body coupled to the body line, a first source/drain node coupled to the first line, and a second source/drain node. Each of the first plurality of storage transistors include a floating gate capacitively coupled to the first word line, where a first end of the first plurality of storage transistors is coupled to the second source/drain node of the first access transistor, and where a second end of the first plurality of storage transistors is coupled to the second line.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2D illustrate sectional views of a semiconductor memory device in accordance with embodiments of the present invention, wherein FIG. 2A illustrates a top sectional view while FIGS. 2B-2D illustrate cross-sectional views;

FIG. 4A illustrates an alternative implementation of a memory cell array comprising a differential memory cell in accordance with embodiments of the present invention;

DETAILED DESCRIPTION OF ILLUSTRATIVE EMBODIMENTS

As described above, cost effective non-volatile memory solutions, are typically based on single polysilicon floating gate architecture, and are typically integrated in standard CMOS process. However, due to the use of a common CMOS process, the gate oxides and tunnel oxides of the floating gate device do not have the integrity of a thick oxide custom manufactured for this purpose. Therefore, to improve reliability, a differential approach may be used. Even though this may be sufficient for industrial and consumer devices, it may not be sufficient in applications requiring higher reliability. For example, memory chips in automotive applications request a minimum level of ppm/ppb that is much higher than consumer electronics memory chips.

Embodiments of the present inventions improve reliability of memories significantly without introducing complex digital blocks/circuits and may be easily implemented in small memories. In various embodiments, the memory cell array improves, at the physical array level, reliability of logic data. Embodiments achieve better reliability by using multiple cells for storing a single bit of data in addition to innovative NAND/NOR array arrangement. In further embodiments, as described further below, a flexible periphery architecture can be adopted in order to give different levels of reliability for a given array arrangement.

Figure 1A:
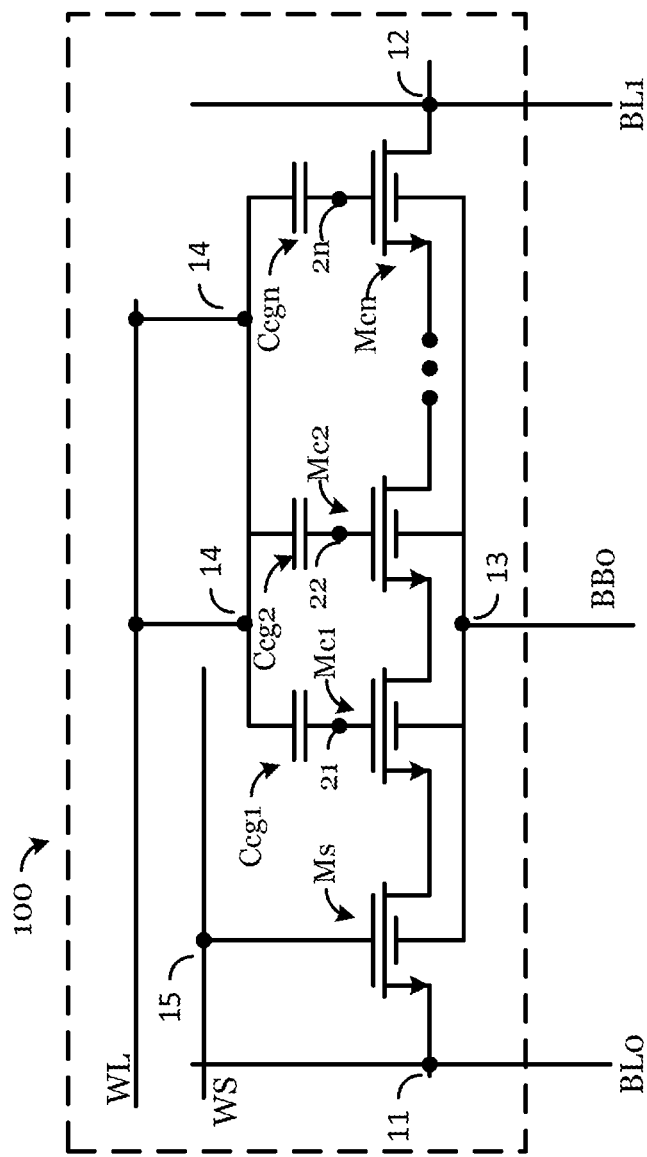
FIG. 1A is a schematic circuit of a memory cell in accordance with embodiments of the present invention.

FIG. 1A is a schematic circuit of a memory cell in accordance with embodiments of the present invention.

The memory cell 100 is part of a memory array as will be described further. Referring to FIG. 1A, an N-MOS select transistor (Ms) and a plurality of N-MOS floating gate storage transistors (Mc1, Mc2, . . . Mcn) are coupled together in series and have a common body contact node 13 that is coupled to a body bias line (BB0). The select transistor Ms has a select gate node coupled to an access control line (WS). The source node 11 of the select transistor Ms is coupled to first bit line BL0. The opposite drain node is coupled to the plurality of N-MOS floating gate storage transistors (Mc1, Mc2, . . . Mcn) through a plurality of common source/drain regions.

Each of the N-MOS floating gate storage transistors (Mc1, Mc2, . . . , Mcn) includes a floating gate node. For example, the first floating gate storage transistor Mc1 has a first floating gate 21 coupled through a first capacitor Ccg1 to the gate node 14, the second floating gate storage transistor Mc2 has a first floating gate 22 coupled through a second capacitor Ccg2 to the gate node 14, and a nth floating gate storage transistor Mcn has a first floating gate $2n$ coupled through a nth capacitor Ccgn to the gate node 14. The gate node 14 is coupled to a word line though one or more interconnects at different locations along the N-MOS floating gate storage transistors (Mc1, Mc2, . . . , Mcn). The drain node 12 of the nth floating gate storage transistor Mcn is coupled to a second bit line BL1.

The memory cell is configured to store a single bit using all of the storage transistors. For example, when the number of storage transistor (n) is 3, the memory cell comprises four transistors (including the select transistor) storing a single bit. Similarly, when the number of storage transistor (n) is 2, the memory cell comprises three transistors (including the select transistor) storing a single bit.

The measured data during a read operation shows a data value depending on the states of all of the floating gate storage transistors (Mc1, Mc2, . . . , Mcn). During program operation, all the storage nodes ($21$-$2n$) are programmed to include additional electrons, which would increases the threshold voltage of the N-MOS transistors. The higher threshold voltage is sensed by biasing the transistors and sensing a source to drain current flowing through the transistors. Advantageously, even if one of the transistor loses its charge due to an error, the remaining transistors would continue to maintain charge and therefore the current conduction from the source node 11 to the drain node 12 is similar to a programmed transistor. In other words, the higher threshold voltage transistor would be the critical transistor blocking the flow of current when one or more of the storage transistors loses charge and starts to conduct.

Another way to implement redundancy is by stacking two (or more) adjacent memory cells in series. However, such an implementation is not efficient because of the introduction of additional select transistors. Thus, the memory cell described in this embodiment of FIG. 1A is more area efficient resulting in a lower cell pitch (e.g., distance between adjacent bit lines).

Figure 1B:
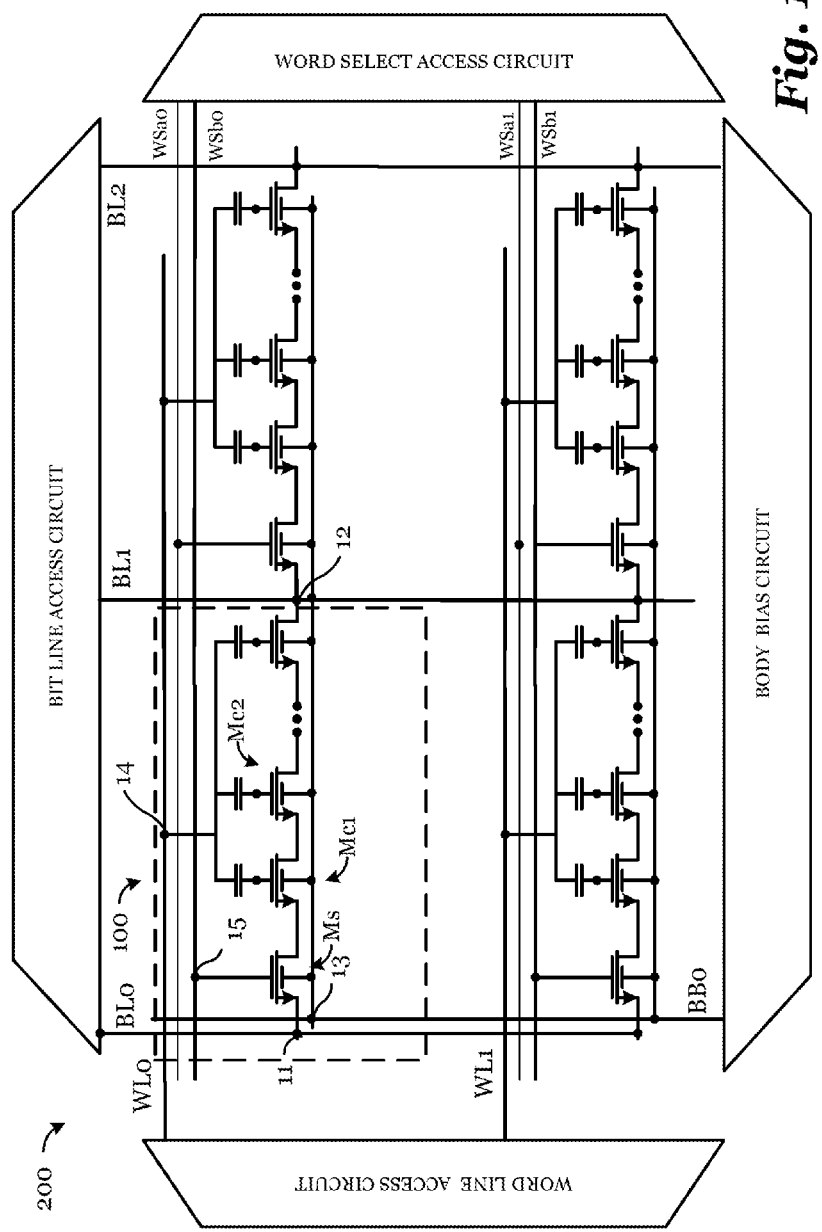
FIG. 1B is a schematic circuit of a memory cell array comprising n-storage transistors per cell in accordance with embodiments of the present invention.

FIG. 1B is a schematic circuit of a memory cell array comprising n-storage transistors per cell in accordance with embodiments of the present invention.

A memory cell array may be formed by arranging a plurality of memory cells in rows and columns. Each of the memory cell 100 may be similar to the memory cell 100 shown in FIG. 1A. Referring to FIG. 1B, the source node 11 of the memory cell 100 is coupled to a bit line access circuit through a first bit line BL0, the drain node 12 is coupled to the bit line access circuit through a second bit line BL2. The gate of the select transistor is coupled to a word select access circuit using a corresponding word select line. In one embodiment, alternative select transistors in a row are coupled to a different word select line (WSa0 or WSb0) so that adjacent cells can be turned off. The gate node 14 of the floating gate storage transistors (Mc1, Mc2, . . . , Mcn) is coupled to word line access circuit through a corresponding word line WL0. Similarly, bodies of all the transistors in the memory array are coupled to a body bias circuit through a common body bias line BB0.

In various embodiments, the program, erase, and read operations may vary depending on the selected device design of the memory cell. In various embodiment, programming may be performed by transfer of electrons from the body into the floating gate or alternatively from the control gate into the floating gate. Similarly, in various embodiments, the erasing may be performed by transfer of electrons from the floating gate into the body or alternatively from floating gate into the control gate.

As one illustration, in one embodiment, the floating gate storage transistors (Mc1, Mc2, . . . , Mcn) are programmed by biasing the body contact node 13 to ground, biasing the first word line WL0 coupled to the corresponding control gate nodes 14 is biased to a very high positive voltage (for example, 13V) while all other words are brought to ground. The bit line BL0 of the selected memory cell 100 is biased to ground, while the other bit lines BL (BL2, . . . , BLn) are biased to a low positive voltage (for example, 3.5V) to inhibit program operation on that related floating gate storage transistors. Therefore, the drain nodes 12 of the memory cells 100 in the column of the selected memory cell 100 and the source nodes 11 of the memory cells 100 in the following column are brought to ground. Moreover, all the odd and even selection gate lines such as Wsa0, Wsb0 are biased to ground.

Thus, during the program operation, all the select transistors are switched off and the floating gates of the floating gate storage transistors (Mc1, Mc2, . . . , Mcn) of the selected memory cell 100 is biased to the very high voltage (13V) while the body is at ground. This high electric field causes electrons in the body to tunnel through the gate dielectric of the corresponding floating gate storage transistors (Mc1, Mc2, . . . , Mcn).

The floating gate storage transistors (MC1, Mc2, . . . , Mcn) may be erased by the opposite operation, i.e., the body is brought to a very high voltage (e.g., 13V) while the floating gate is at the ground.

During a read operation, the first bit line BL0 is programmed to a reference voltage (e.g., 0V) while the second bit line BL1 is programmed to very low positive voltage (e.g., 1V). Accordingly, the drain node 12 of the memory cell 100 and the source nodes of the memory cells in the immediately following column are brought to 1V, while all the other drain nodes and source nodes including the source node 11 of the memory cell 100 are brought to ground.

At the same time or prior to charging the bit lines, the first word line WL0 coupled to the corresponding control gate nodes 14 is biased to a high positive voltage (for example, 5V), while the other word lines WL are biased to ground. The odd/even word select line that is coupled to the select transistor is coupled to a low positive voltage (for example, 3V) while all other word select lines are biased to ground. All the bodies of the transistors are coupled to ground as well through the body bias line BB0. All diodes including parasitic diodes are reverse biased during the read operation.

Each selected memory cell 100 is enabled by the voltage at the gate node 14 of the storage transistor Mc (5V), which is transferred to its floating gate by capacitive coupling, and by the voltage at its drain node 12 (1V). At the same time, because the gate of the select transistor is at moderate positive voltage (e.g., 3V), the select transistor Ms is switched on so as to bring the source of the storage transistor Mc to ground. If the selected memory cell is erased, the floating gate storage transistors (Mc1, Mc2, . . . Mcn) have a lower threshold voltage and are therefore in ON mode. In the ON mode, because of the potential difference between the floating gate (5V) and the source (0V), current flows through the corresponding bit line BL1 so that the logic value 1 is read. On the other hand, if the selected memory cell is programmed, the floating gate storage transistors (Mc1, Mc2, . . . Mcn) have a high threshold voltage and are therefore in OFF mode and no current flows through the corresponding bit line BL, so that the logic value 0 is read.

Figure 1C:
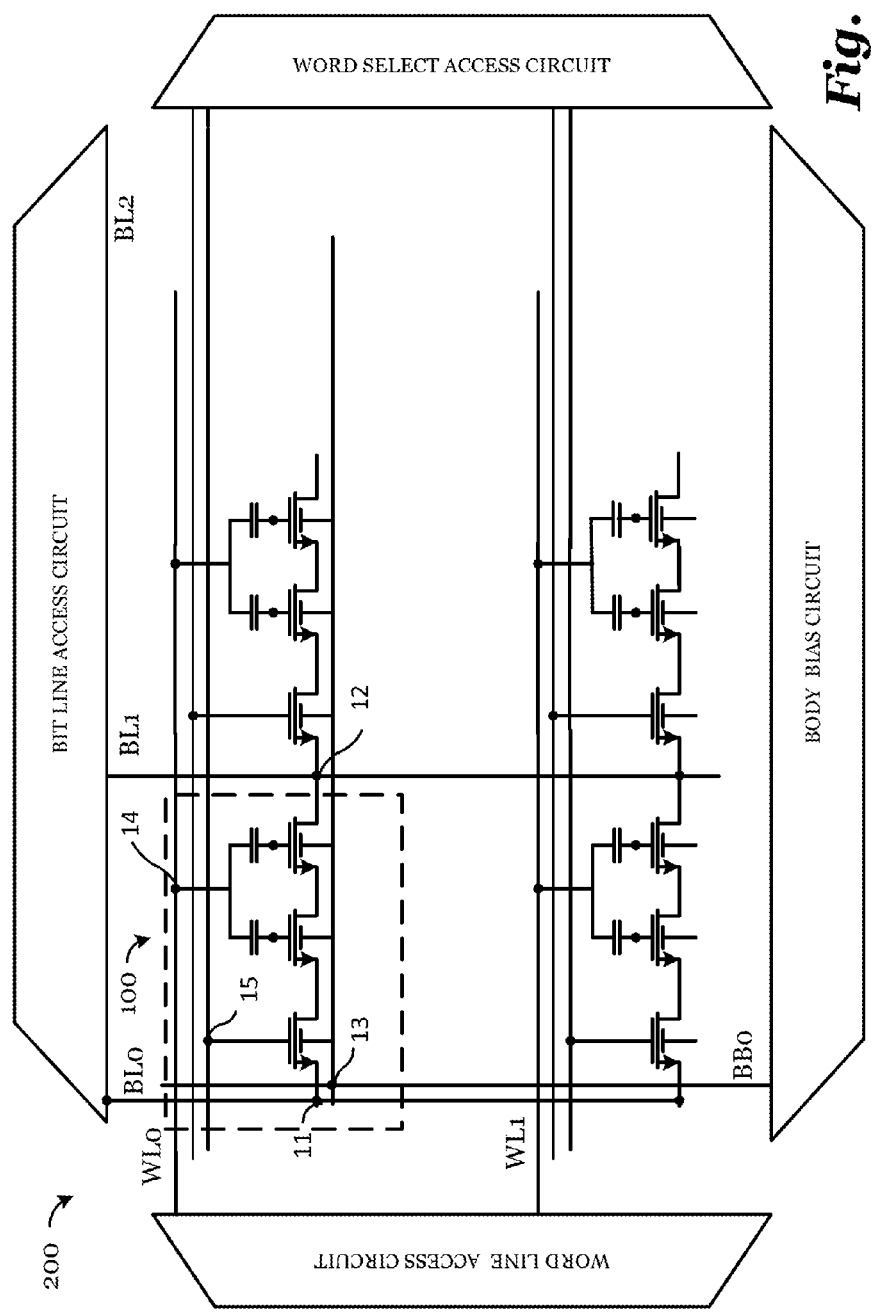
FIG. 1C is a schematic circuit of a memory cell array comprising two storage transistors per cell in accordance with embodiments of the present invention.

FIG. 1C is a schematic circuit of a memory cell array comprising two storage transistors per cell in accordance with embodiments of the present invention.

FIG. 1C is a more specific embodiment relative to FIG. 1B. Unlike FIG. 1B, which shows a number of floating gate transistors, the embodiment of FIG. 1C specifically shows two storage transistors. Thus, the memory cell array of FIG. 1C includes two storage cells for storing a duplicate value of the data. While the two storage cell design is efficient, it also has less redundancy.

Figure 1D:
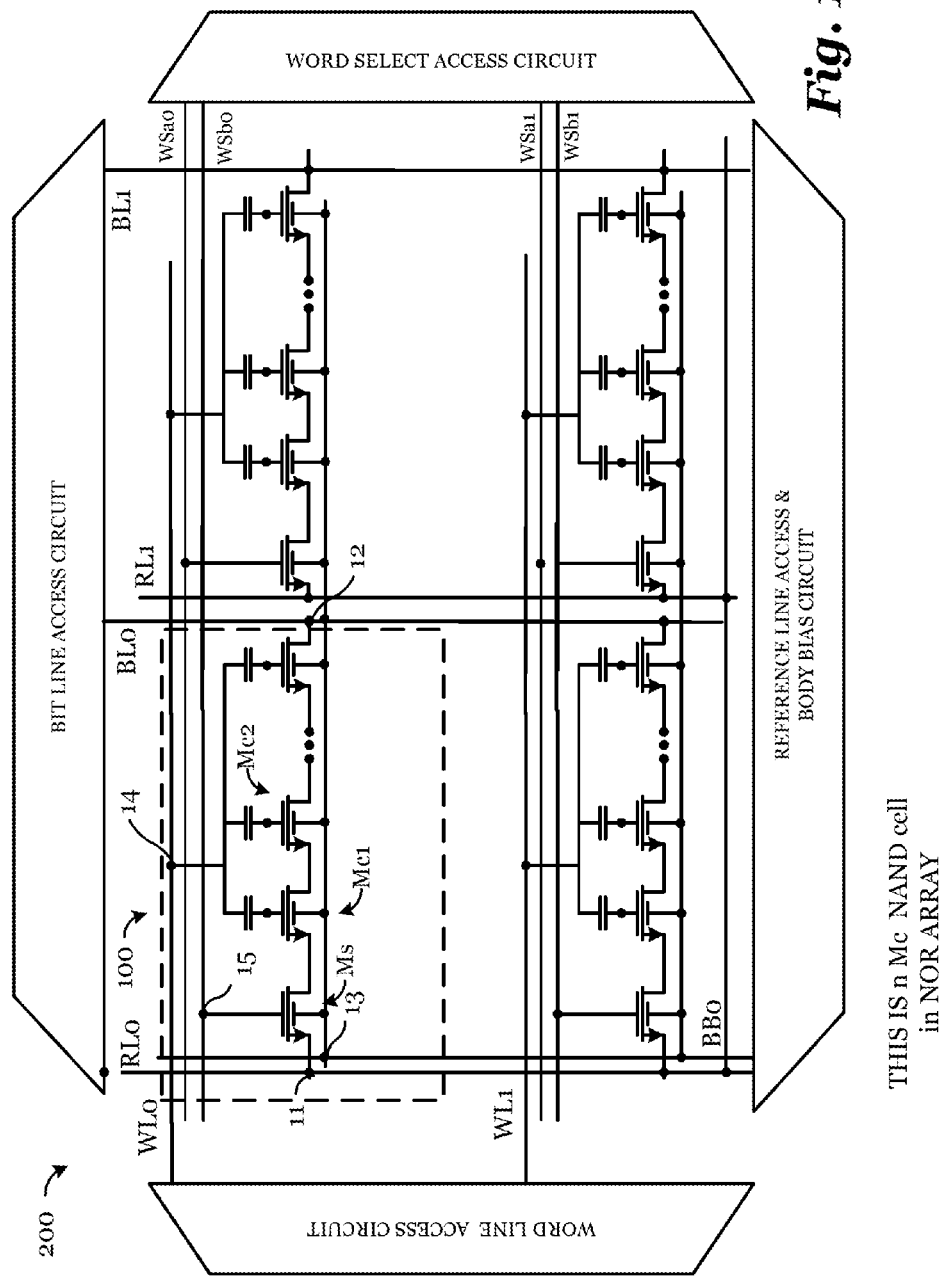
FIG. 1D is a schematic circuit of a memory cell array comprising multiple storage transistors per cell arranged in an alternative layout in accordance with embodiments of the present invention.

FIG. 1D is a schematic circuit of a memory cell array comprising multiple storage transistors per cell arranged in an alternative layout in accordance with embodiments of the present invention.

In this embodiment, the memory cell 100 is arranged as a NOR array. Referring to FIG. 1D, similar to a NOR array, the source nodes 11 of each memory cell 100 are coupled to reference lines instead of bit lines. All the reference lines RL0 and RL1 across the array may be tied together and biased to the same potential.

Accordingly, in various embodiments, a NAND sub array is implemented in a NOR architecture. In other words, each of the individual memory cell 100 is designed as a NAND sub-array while the memory cells are arranged in a top NOR array arrangement.

Figure 2A:
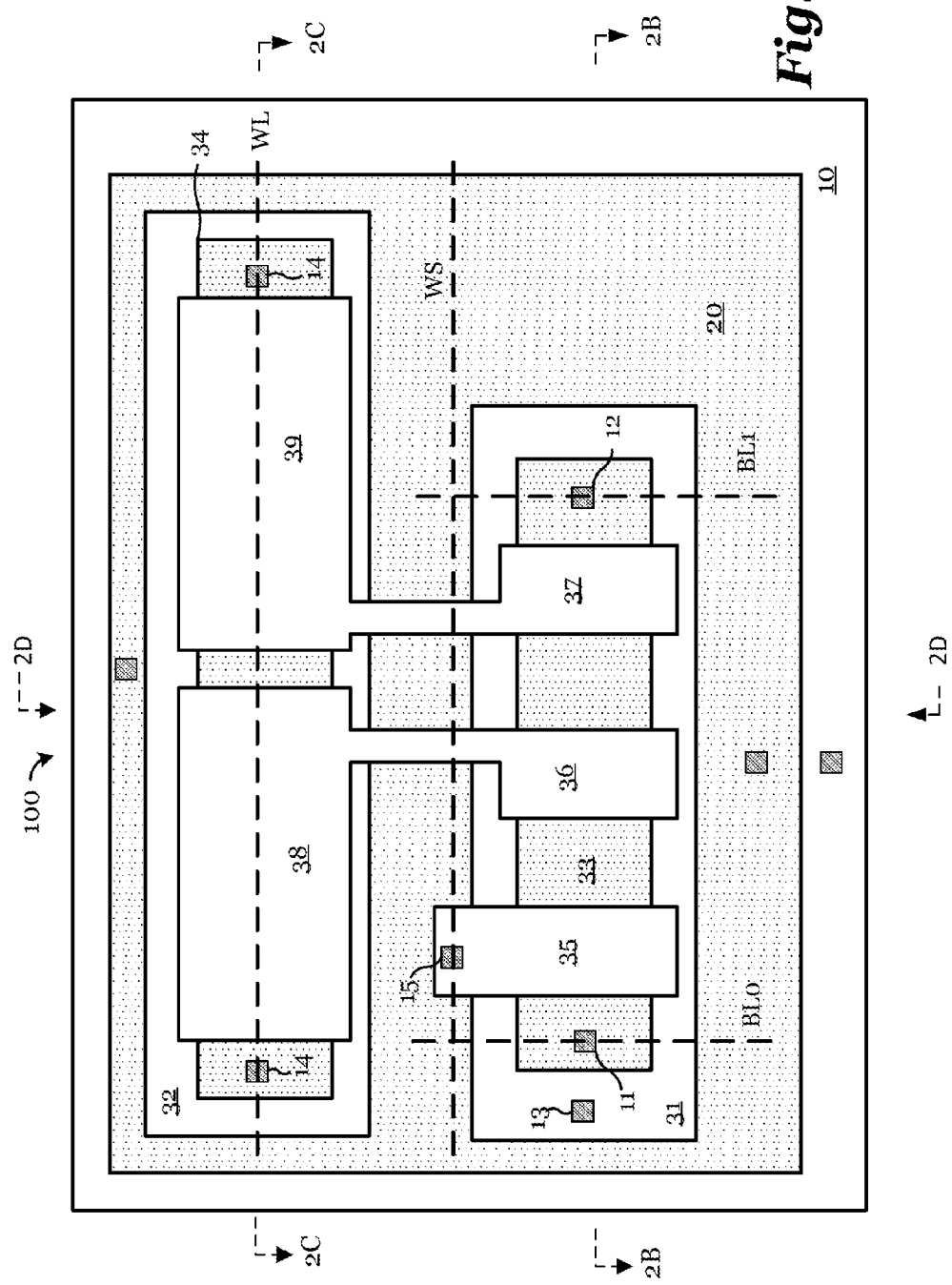
Figure 2B:
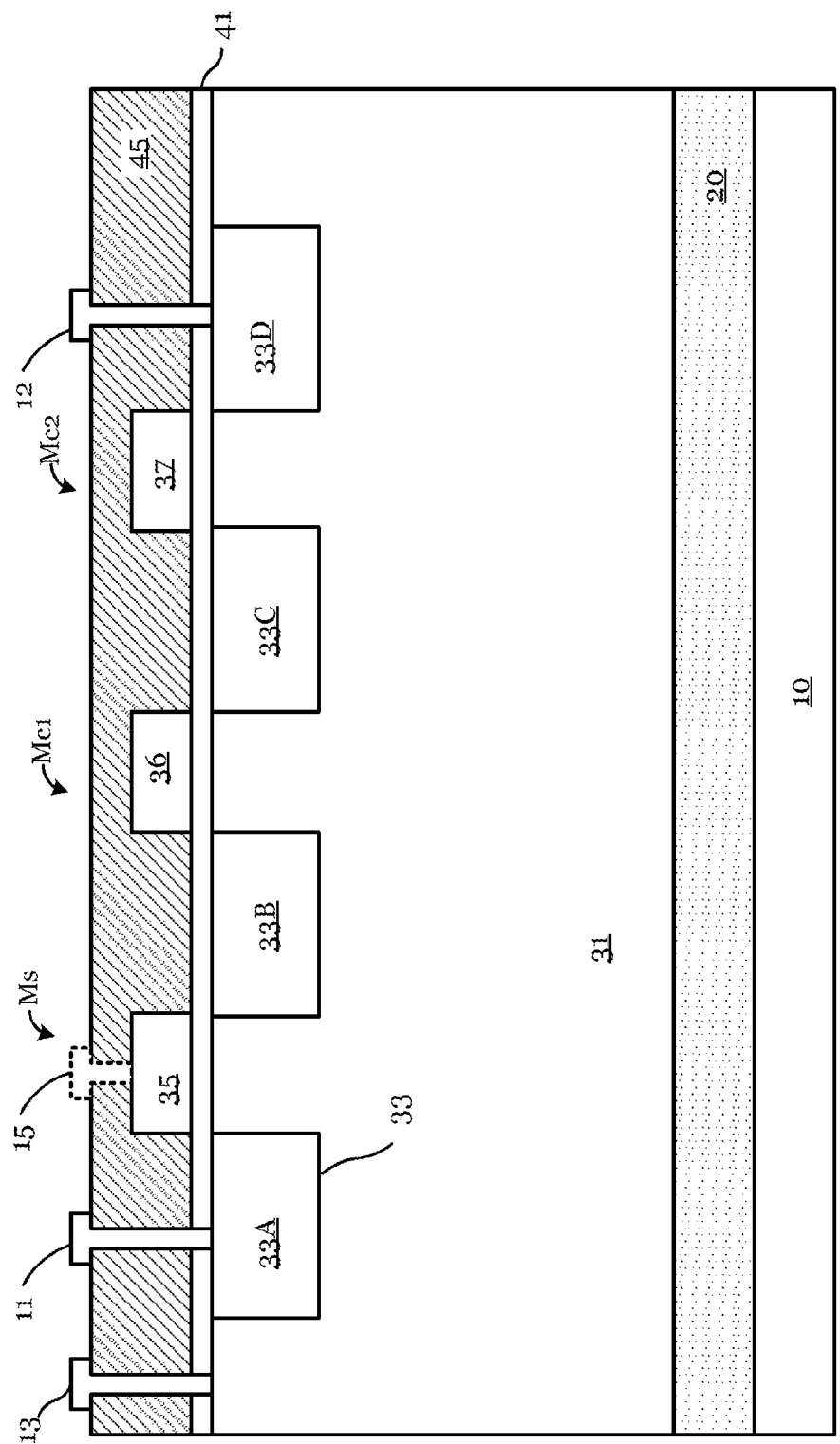
Figure 2C:
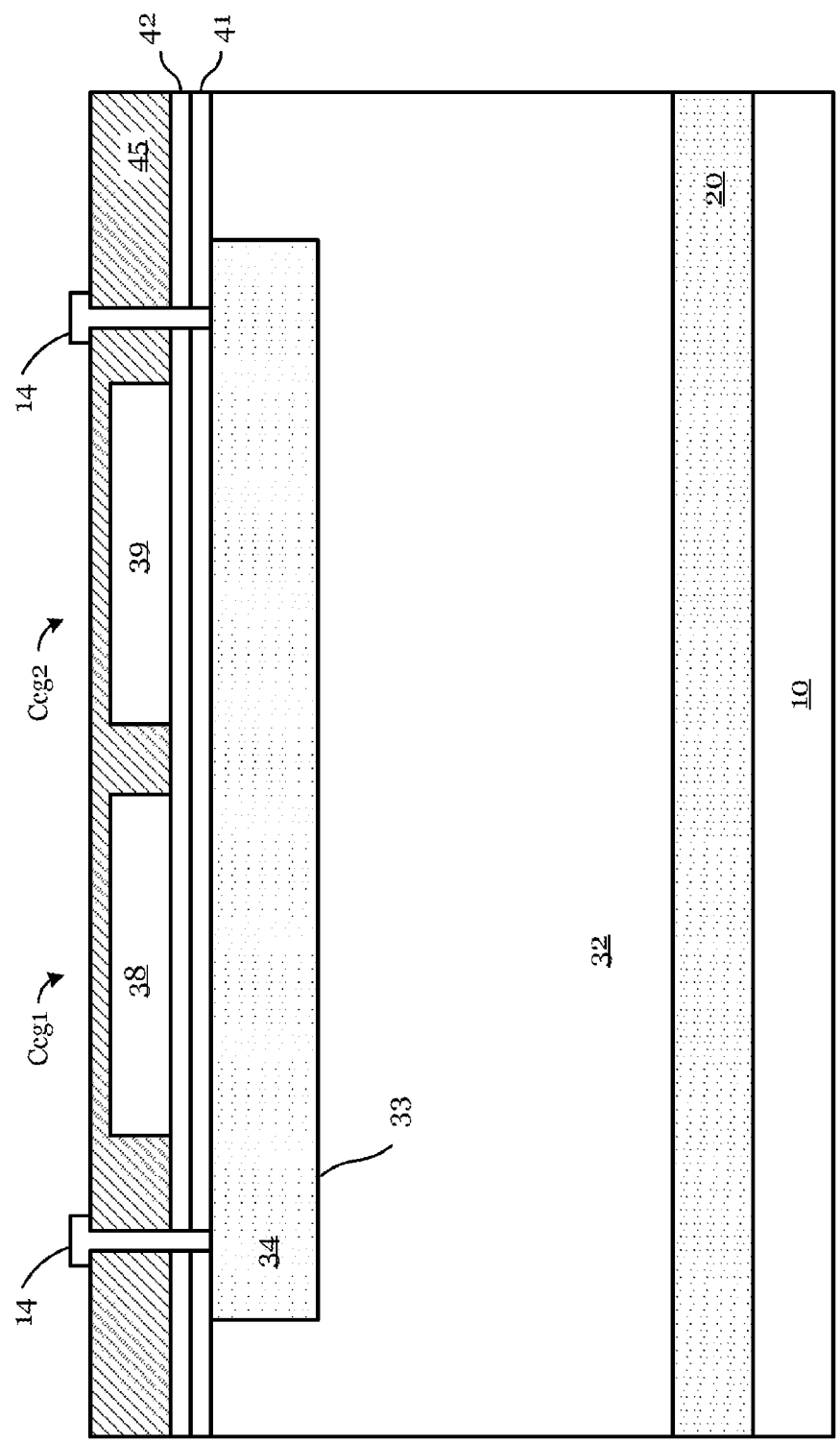
Figure 2D:
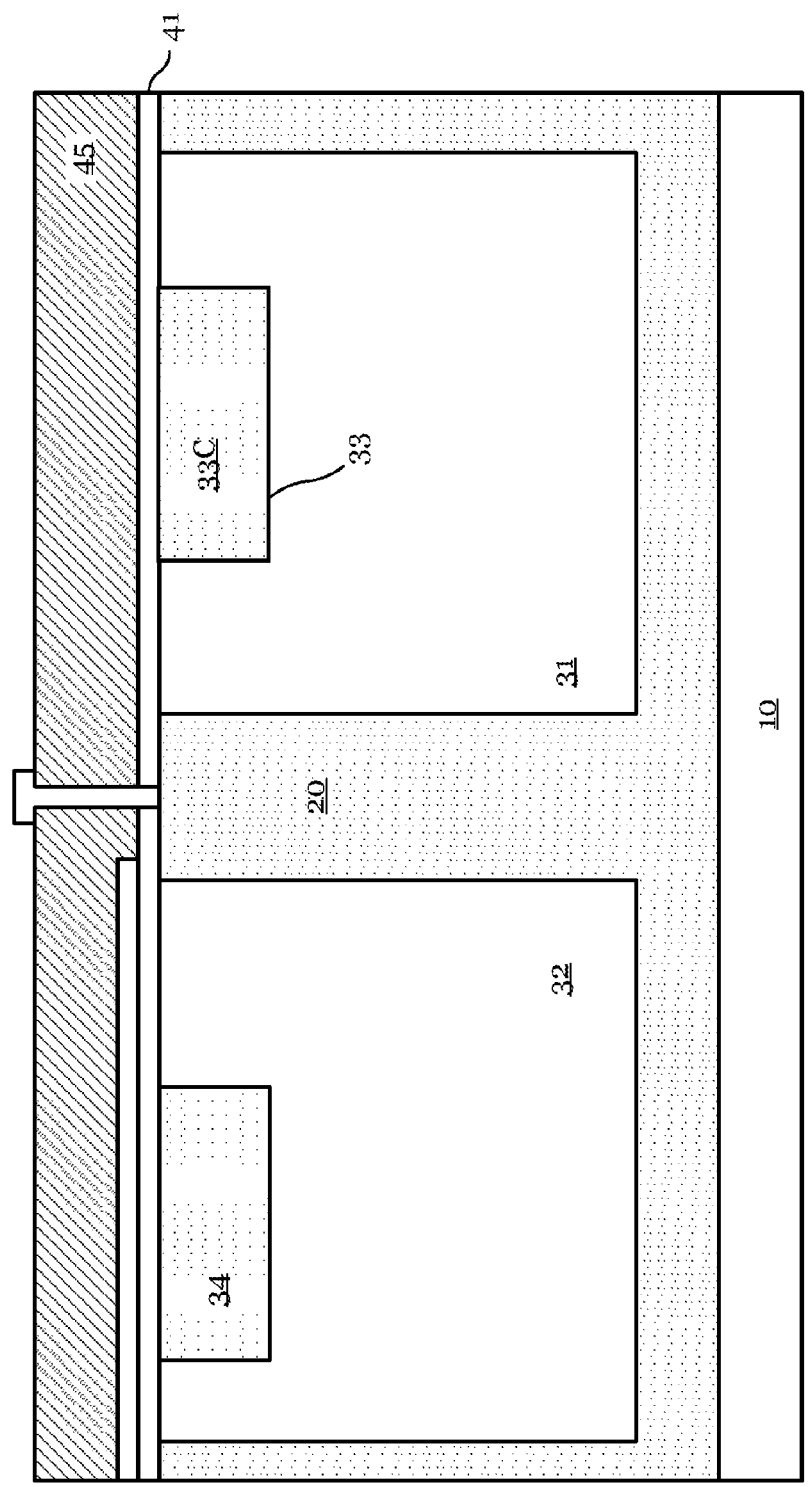

FIGS. 2A-2D illustrate sectional views of a semiconductor memory device in accordance with an embodiment of the present invention. FIG. 2A illustrates a top sectional view while FIGS. 2B-2D illustrate cross-sectional views.

Referring to FIG. 2A, the memory device is integrated in a substrate 10 of a semiconductor material. The substrate 10 may be a bulk silicon device in one embodiment. In other embodiments, the substrate 10 may comprise a silicon carbide substrate. In alternative embodiments, the substrate 10 may comprise a gallium nitride on silicon substrate. In further embodiments, the substrate 10 may comprise heteroepitaxial layers besides having epitaxial layers.

In one embodiment, the substrate 10 is a p-type material. Therefore, a first well 20 having an n-type doping is formed within the substrate 10. Contact pads may be used to directly contact the substrate 10 and the first well 20. All the memory cells 100 in the memory cell array are formed in the common first well 20 that regions of the memory devices extends in the substrate 10 from the front surface of the device. For example, the first well 20 is formed as a buried layer obtained with a high-energy implantation process and contacted with an external contact ring or pad. For example, in one embodiment, a conductive pad contacts the first well 20 through an insulating layer 45.

The memory cell 100 includes a second well 31 and a third well 32 formed within the common first well 20. The second well 31 and the third well 32 are doped opposite to the first well 20 and have a p-type doping in one embodiment. The second well 31 and the third well 32 are formed within the first well 20. The second well 31 is isolated from the third well 32 by a portion of the first well 20 (see also FIG. 2D).

A contact pad contacts the second well 31 and forms the body contact node 13. Similarly, another contact pad contacts the third well 32. A plurality of source/drain regions 33, which may be heavily doped N+ regions in one embodiment, are formed in the second well 31. Each of the plurality of source/drain regions 33 are separated from an adjacent one of the plurality of source/drain regions 33 by a gate line. The plurality of source/drain regions 33 may be formed by implantation and annealing in one embodiment.

In one embodiment, the memory cell comprises four source/drain regions 33 that include a first heavily doped region 33A, a second heavily doped region 33B, a third heavily doped region 33C, and a fourth heavily doped region 33D (FIG. 2B). The first heavily doped region 33A and the second heavily doped region 33B along with the gate line 35 are part of the select transistor Ms. The second heavily doped region 33B and the third heavily doped region 33C along with a first floating gate line 36 form a first floating gate transistor Mc1. Thus, the second heavily doped region 33B is shared between the select transistor Ms and the first floating gate transistor Mc1. The third heavily doped region 33C and the fourth heavily doped region 33D along with a second floating gate line 37 form a second floating gate transistor Mc2. Accordingly, all the transistors of the memory cell share a common second well 31. The heavily doped regions are heavily extrinsic semiconductor regions comprising a doping greater than $5 \times 10^{18}$ cm$^{-3}$ in various embodiments, and between $1 \times 10^{19}$ cm$^{-3}$ to $5 \times 10^{20}$ cm$^{-3}$ in one embodiment.

The first gate line 35, the first floating gate line 36, the second floating gate line 37 may comprise a polysilicon layer. In one embodiment, the first gate line 35, the first floating gate line 36, the second floating gate line 37 may comprise a single polysilicon layer. In various embodiments, the polysilicon layer is formed using a common gate process for the standard CMOS process. In alternative embodiments, the first floating gate line 36, the second floating gate line 37 may comprise a metal layer such as titanium nitride, which may include other materials such as aluminium. The gate lines are separated from the second well 31 by a gate dielectric layer 41. The gate dielectric layer 41 may comprise an oxide layer in one embodiment. In further embodiments, the gate dielectric layer 41 may comprise a nitride layer or combinations of oxide and nitride layers.

As also illustrated in FIG. 2B, a conductive pad contacts the first heavily doped region 33A through an opening in the insulating layer 45 so as to form a source node 11. Another conductive pad contacts the last of the plurality of source/drain regions 33, in this case, the fourth heavily doped region 33D, through another opening in the insulating layer 45 so as to form a drain node 12. The intermediate ones of the plurality of source/drain regions 33 are all left floating. A conductive pad contacts the first gate line 35 through an opening in the insulating layer 45 so as to form a select gate node 15.

Referring to FIGS. 2A and 2C, a fifth heavily doped region 34 is formed in the third well 32. The fifth heavily doped region 34 is formed at the same time as the plurality of source/drain regions 33. The fifth heavily doped region 34 is coupled through one or more conductive pads to gate node 14. The fifth heavily doped region 34 forms the common control gate of the floating gate transistors. As also seen in FIG. 2A, the first floating gate line 36 connects to the first capacitor electrode 38 while the second floating gate line 37 couples to the second capacitor electrode 39.

In various embodiments, the first capacitor electrode 38 and the second capacitor electrode 39 may be separated from the fifth heavily doped region 34 by the gate dielectric layer 41. In further embodiments, an additional insulating layer 42 may be deposited before forming the first capacitor electrode 38 and the second capacitor electrode 39. The additional insulating layer 42 may be used to prevent charge leakage from/into the fifth heavily doped region 34. However, the additional insulating layer 42 may not be used because it would require an additional mask step, which increases production costs.

Figure 3A:
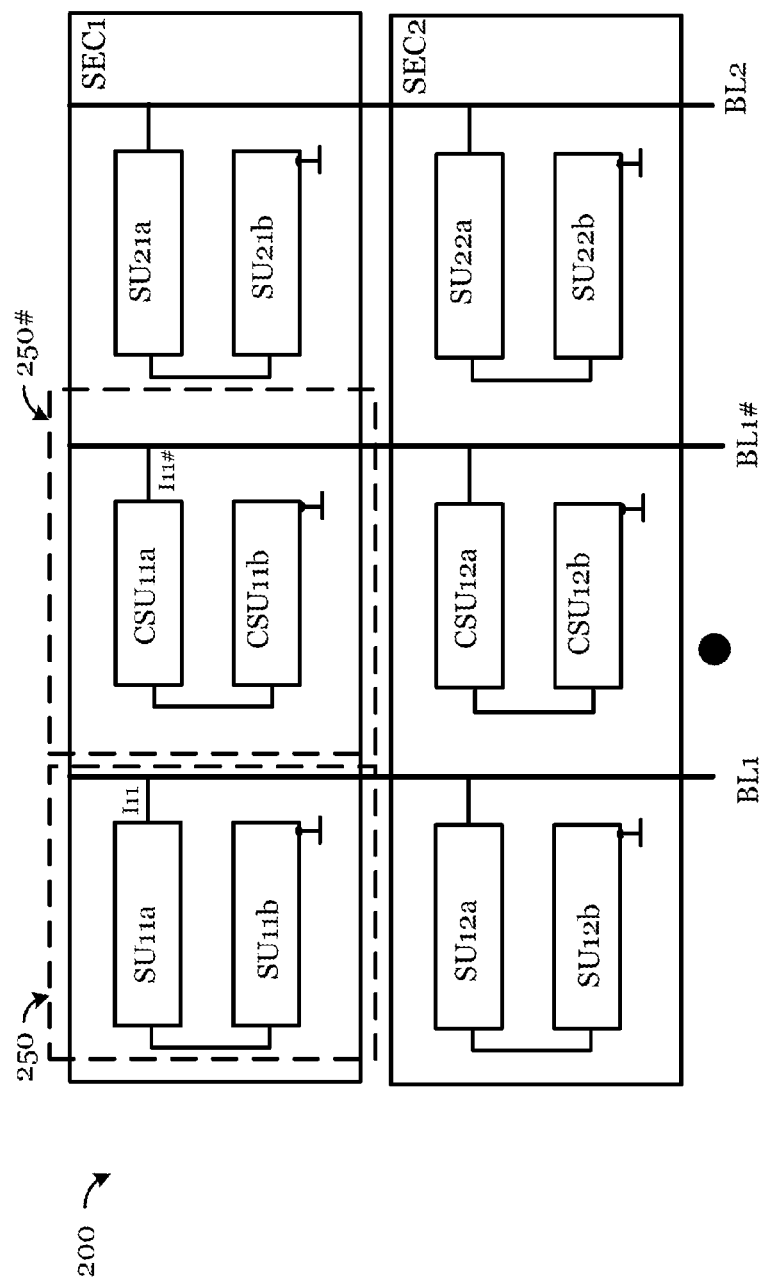
FIG. 3A illustrates a differential memory cell implementing embodiments of the present invention.

FIG. 3A illustrates a differential memory pair implementing embodiments of the present invention.

Referring to FIG. 3A, a memory cell array 200 comprises a plurality of storage units (SU) arranged along sectors (SEC) or as blocks of memory cells. Only two sectors are illustrated for clarity. Each storage unit SU is configured to hold a single bit value. As illustrated, in one embodiment, a differential memory pair is formed using a storage cell 250 and a complementary storage cell 250#. Each storage cell 250 comprises one or more storage units SU coupled in series. For example, the selected storage cell 250 comprises a first storage unit SU11$a$ and a second storage unit SU11$b$ coupled in series. Each storage unit such as the first storage unit SU11$a$ and the second storage unit SU11$b$ comprise a charge storage transistor. Further, all the storage units within a storage cell 250, e.g., the first storage unit SU11$a$ and the second storage unit SU11$b$, store the same value. In contrast, the complementary storage cell 250# stores the opposite phase to that of the storage cell 250. Therefore, the first complementary storage unit CSU11$a$ and the second complementary storage unit CSU11$b$ store a value opposite to that stored in the first storage unit SU11$a$ and the second storage unit SU11$b$.

The storage cell 250 and the complementary storage cell 250# are programmed and erased by biasing at the same time in various embodiments. Additionally, they may be also read by biasing for the read operation at the same time. For example, by biasing the bit lines, only the storage cell 250 and the storage cell 250# may be selected to be read at the same time. Accordingly, during a read operation, depending on the value stored in the first storage unit SU11$a$ and the second storage unit SU11$b$, a first current I11 is read in the first bit line BL1. Similarly, depending on the value stored in the first complementary storage unit CSU11$a$ and the second complementary storage unit CSU11$b$, a first complementary current I11# is read in the first complementary bit line BL1#.

The value stored in the differential memory cell comprising the storage cell 250 and the complementary storage cell 250# is obtained at a read circuit by sensing, e.g., using sense amplifiers, and differentially comparing the first current I11 and the first complementary current I11#. Thus if even one of the two storage units in a storage cell has a single bit error by losing charge, the other storage unit still maintains the overall value of the storage cell. However, this configuration is more prone to corruption when a charge is gained during a single bit error.

Although, in this embodiment, only two storage units are shown within each of the storage cell 250 and the storage cell 250#, in various embodiments, more number of storage units may be formed within each of the storage cell 25$o$ and the storage cell 250#.

Figure 3B:
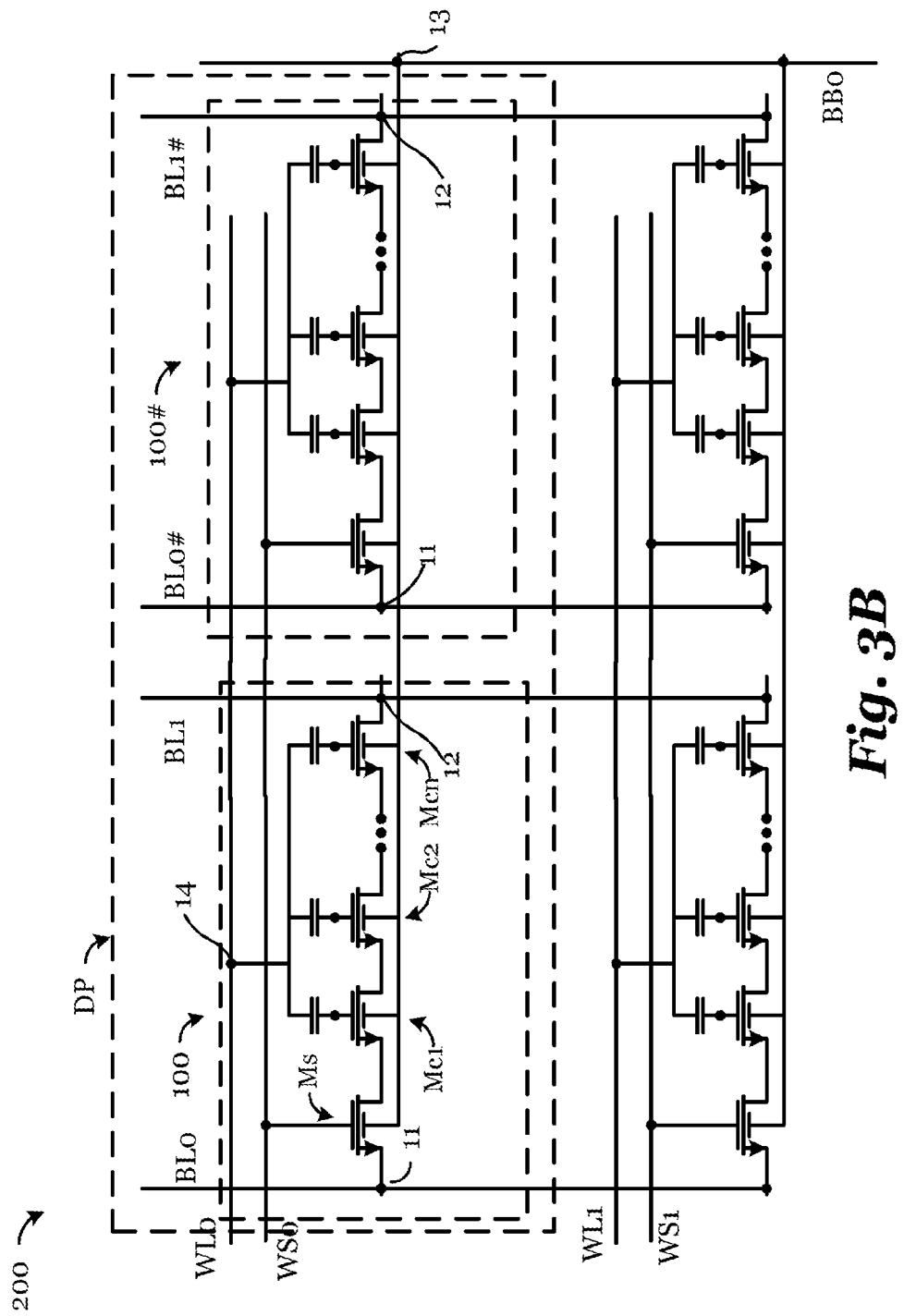
FIG. 3B illustrates a schematic memory cell array implementing a differential memory cell pair in accordance with embodiments of the present invention.

FIG. 3B illustrates a more specific schematic memory cell array implementing a differential memory cell pair in accordance with embodiments of the present invention.

FIG. 3B illustrates an embodiment of implementing the memory cell array 200 described in FIG. 3A. In various embodiments, the memory cell 100 described previously in FIG. 1A is used in the different pair and is therefore not repeated again. Similarly, the memory cells in the differential pairs in this embodiment may be implemented, e.g., using embodiments described in FIGS. 2A-2D and therefore not repeated again. Accordingly, as illustrated in FIG. 3A, the memory organization is merged with a top NOR arrangement. In this case, the memory cells are arranged to form a differential pair. In a differential pair, one of the memory cell stores a bit that is being stored while another memory cell stores the complementary value of the bit. For example, in FIG. 3A, the memory cell 100 stores a "1" while the complementary memory cell 100# stores a "0."

During a program read operation, the first bit line BL0 and the first complementary bit line BL0# are programmed to a reference voltage (e.g., 0V) while the second bit line BL1 and the second complementary bit line BL1# are programmed to very low positive voltage (e.g., 1V). Accordingly, the drain node 12 of the memory cell 100 and the complementary memory cell 100# in the column of the selected differential pair DP and the source nodes of the memory cells in the following column are brought to 1V, while all the other drain nodes and source nodes including the source node 11 of the memory cell 100 and the complementary memory cell 100# in the selected different pair DP are brought to ground.

At the same time or prior to charging the bit lines, the first word line WL0 coupled to the selected differential pair DP (and then the corresponding control gate nodes 14) is biased to a high positive voltage (for example, 5V), while the other word lines WL are biased to ground. The odd/even word select line that is coupled to the select transistor is coupled to a low positive voltage (for example, 3V) while all other word select lines are biased to ground. All the bodies of the transistors are coupled to ground as well through the body bias line BB0. The first well 20 that is common to all the transistors is biased to a high positive voltage (e.g., 5V). All other wells such as the second well 31 and the third well 32 along with the substrate 10 (see e.g., FIG. 2A) are also grounded so that all diodes are reverse biased during the read operation.

Each selected memory cell 100 and complementary memory cell 100# of the differential pair is enabled by the voltage at the gate node 14 of the storage transistor Mc (5V), which is transferred to its floating gate by capacitive coupling, and by the voltage at its drain node 12 (1V). At the same time, because the gate of the select transistor is at moderate positive voltage (e.g., 3V), the select transistor Ms is switched on so as to bring the source of the first floating gate storage transistor Mc1 to ground. If the selected memory cell is erased, the floating gate storage transistors (Mc1, Mc2, . . . Mcn) have a lower threshold voltage and are therefore in ON mode. In the ON mode, because of the potential difference between the drain node 12 (1V) and the source of the first floating gate transistor Mc1 (0V), current flows through the corresponding bit line BL1 so that the logic value 1 is read. On the other hand, if the selected memory cell is programmed, the floating gate storage transistors (Mc1, Mc2, . . . Mcn) have a high threshold voltage and are therefore in OFF mode and no current flows through the corresponding bit line BL, so that the logic value 0 is read.

Referring now to the differential pair, for storing a single bit, for example, "1", the memory cell 100 may be erased so that the floating gate storage transistors (Mc1, Mc2, . . . Mcn) have a lower threshold voltage while at the same time the complementary memory cell 100# may be programmed so that the floating gate storage transistors (Mc1, Mc2, . . . Mcn) have a higher threshold voltage. Accordingly, in this example, when the differential pair is biased for the read operation, a source to drain current flows through each of the floating gate storage transistors (Mc1, Mc2, . . . Mcn) in the memory cell 100 while no current flows through each of the floating gate storage transistors (Mc1, Mc2, . . . Mcn) in the complementary memory cell 100#. The currents through the corresponding first bit line BL1 and the complementary first bit line BL1# may be differentially sensed by read circuits to identify the value of the bit stored in the differential pair.

Conversely, in the next (unselected) memory cells 100 in the same column as the selected memory cell 100 and selected complementary memory cell 100# (whose source nodes are coupled to the same bit lines BL0 and BL0#), the select transistors Ms are switched off. Likewise, in each unselected memory cell 100 of the same row as the selected memory cell 100 and selected complementary memory cell 100#, the selection transistor Ms is switched off. Therefore, no ON current can flow through the storage transistor Mc of each one of these unselected memory cells 100. A subthreshold OFF current may still flow through the transistors that are in the OFF state. In each one of the other unselected memory cells 100, the storage transistor Mc is always switched OFF (and the corresponding bit line BL is disconnected from the read/write/erase circuits).

Because of the series configuration, this memory cell array design enforces programmed cell design, where there is limited or no current flow when the cell is addressed.

Figure 3C:
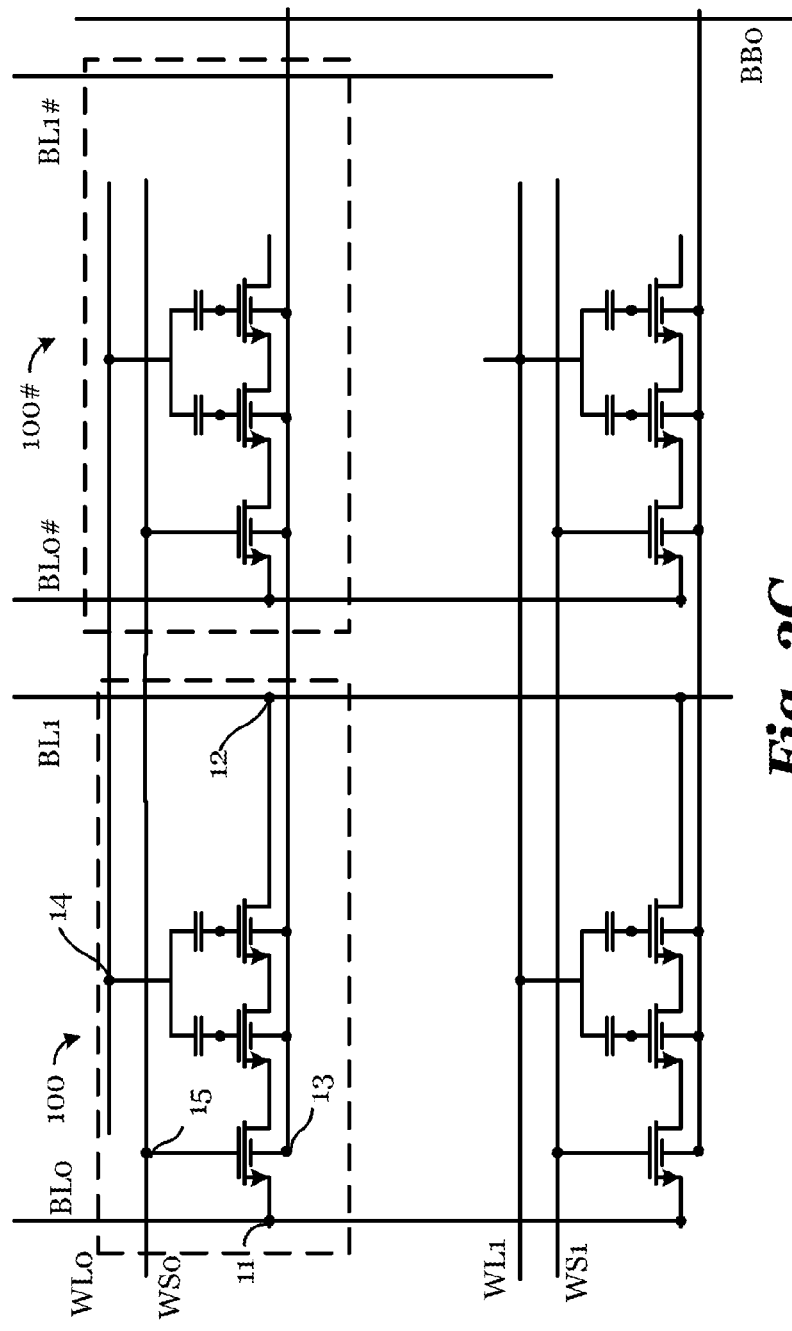
FIG. 3C is an alternative implementation of the memory cell having two storage transistors in accordance with embodiments of the present invention.

FIG. 3C is an alternative implementation of the memory cell having two storage transistors in accordance with embodiments of the present invention. FIG. 3C illustrates an embodiment of implementing the memory cell array 200 described in FIG. 3A.

Unlike the prior embodiment, in this embodiment, each memory cell has two storage transistors. Accordingly, the differential pair comprises four storage transistors along with two select transistors. This embodiment would provide improved reliability due to the present of the additional storage transistor in each of the memory cells in the differential pair. Due to the lower number of transistors, this embodiment would have a significant area improvement over the embodiment of FIG. 3B.

Figure 3D:
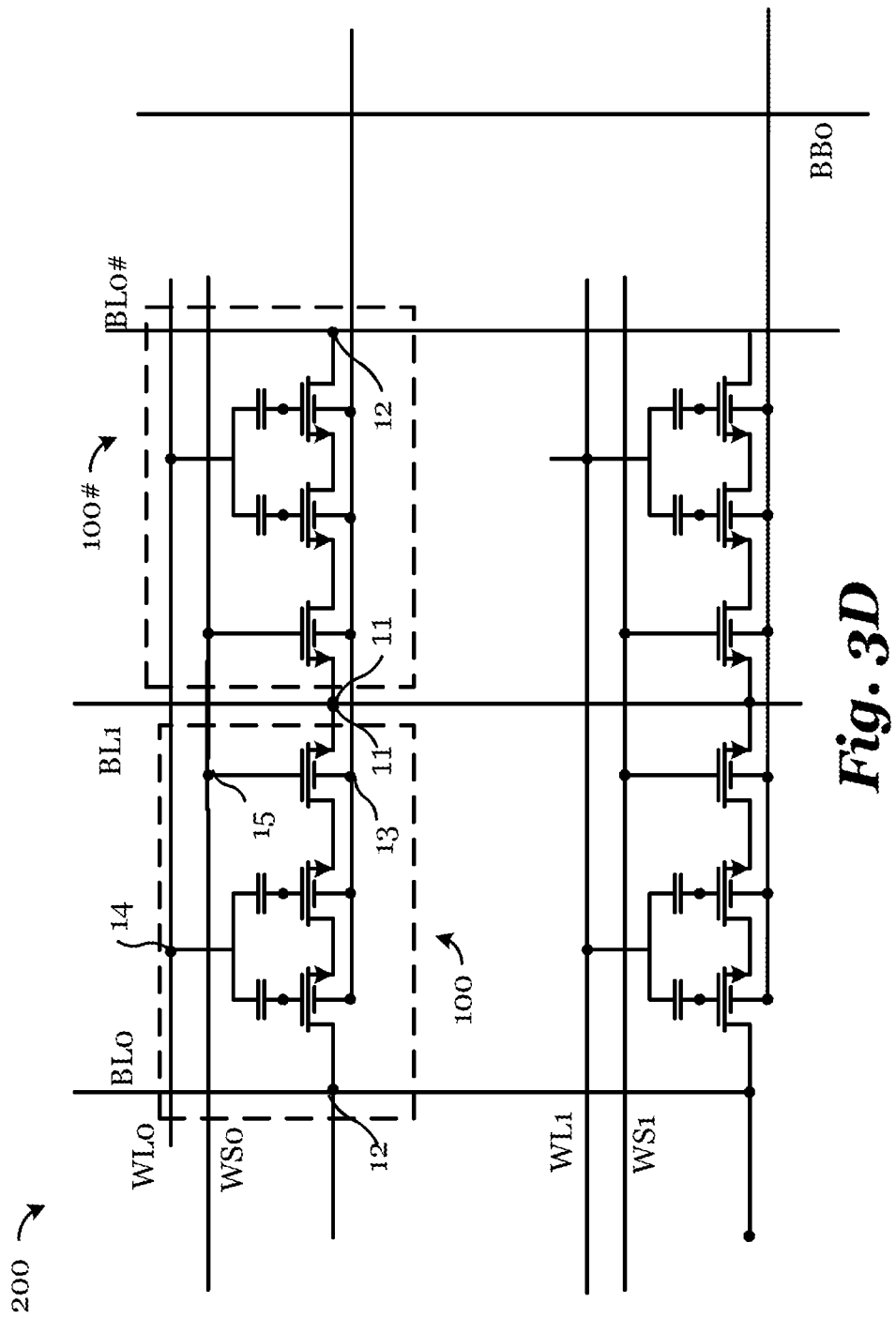
FIG. 3D is another alternative implementation of the memory cell having two storage transistors in accordance with embodiments of the present invention.

FIG. 3D is another alternative implementation of the memory cell having two storage transistors in accordance with embodiments of the present invention. FIG. 3D illustrates an embodiment of implementing the memory cell array 200 described in FIG. 3A.

The embodiment of FIG. 3D is a more compact version of the embodiment illustrated in FIG. 3C. Although not shown, the embodiment of FIG. 3D may also be applied to FIG. 3B. In this embodiment, a common bit line couples to both the select transistors of the differential pair. Thus, the differential pair is symmetrically laid out with respect to the common central bit line. For instance, a common bit line BL1 is coupled to the source node 11 of both the memory cell 100 and the complementary memory cell 100#.

FIG. 4A illustrates an alternative implementation of the memory cell array comprising a differential memory cell in accordance with embodiments of the present invention.

In this embodiment, unlike the embodiments of FIG. 3, additional redundancy is obtained by placing cells in parallel on both side of the differential pair architecture. As illustrated in FIG. 4A, the memory cell array comprises a plurality of sectors SEC1, SEC2, SEC3, . . . , SECn arranged in parallel rows. Each sector comprises a plurality of storage units, where each storage unit has at least one storage transistor for storing a single bit. Accordingly, an array of storage units arranged in plurality of rows and columns is illustrated.

In various embodiments, the memory cell is implemented as a differential pair comprising a memory unit 300 and a complementary memory unit 300#. All the storage units (SU11, SU12, SU13, . . . , SU1n) in the memory unit 300 store the same bit while all the storage units (CSU11, CSU12, CSU13, . . . , CSU1n) in the complementary memory unit 300# store the opposite bit to that stored in the memory unit 300.

In various embodiments, all the memory cells in the differential pair are accessed in parallel. Accordingly, during a read operation, the data from each of the storage units in the same column is read simultaneously. In other words, the read current at the first bit line BL1 is a summation of all the individual currents I11, I12, I13, . . . , I1n. Similarly, the current at the second bit line BL2 is a summation of the individual current from the complementary storage units. The current at the first bit line BL1 and the second bit line BL2 can be compared at a read circuit to identify the value of the bit stored in the differential pair. Because of the parallel configuration, this memory cell array design enforces erased cell design.

In various embodiments, the individual storage units may be flash transistors. In one embodiment, the storage units may include a select transistor and a single floating gate storage transistor. In further embodiments, the storage units may comprise a select transistors and a plurality of floating gate storage transistors, for example, may be implemented as a memory cell illustrated in FIG. 1A.

Accordingly, the memory unit forming a differential memory cell DMC comprises 2n memory cells per bit stored. If the number of sectors used is two, then the differential memory cell comprises four memory cells per bit stored.

Figure 4B:
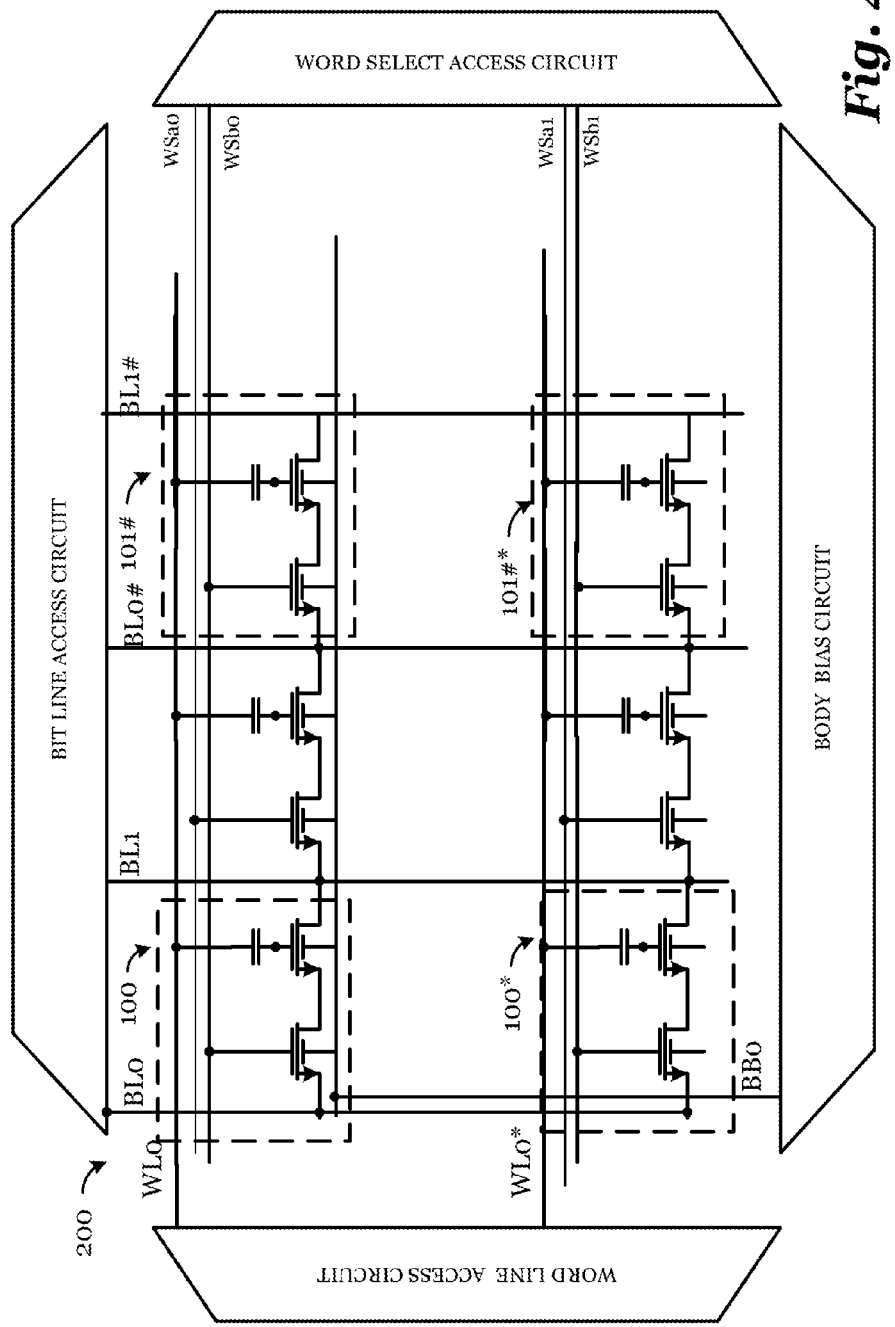
FIG. 4B illustrates a schematic of a memory cell array comprising one storage cell and one select transistor in accordance with embodiments of the present invention.

FIG. 4B illustrates a schematic of a memory cell array comprising one storage cell and one select transistor in accordance with an embodiment of the present invention. FIG. 4B may be one specific implementation of FIG. 4A.

In various embodiments, a regular memory cell may be adapted to perform the differential operation while adding data redundancy. Unlike prior embodiments that required a specific cell array, this embodiment is independent of the architecture of the memory cell array. Additional circuits in the periphery may be used to implement this embodiment.

As illustrated in FIG. 4B, four memory cells are used in this embodiment. Each memory cell may comprise a select transistor and a floating gate storage transistor (and its accompanying storage capacitor). The differential memory unit is formed using the memory cell 100, the duplicate memory cell 100*, the complementary memory cell 100#, and the duplicate complementary memory cell 100#*.

As in prior embodiments, the memory cell 100 and the duplicate memory cell 100* store the same value while the complementary memory cell 100# and the duplicate complementary memory cell 100#* store the opposite value. The memory cell 100 and the duplicate memory cell 100* may be programmed and erased simultaneously by biasing at the same time. Similarly, the complementary memory cell 100#, and the duplicate complementary memory cell 100#* may be programmed and erased simultaneously by biasing at the same time. However, during a read operation, all the four cells may be accessed in parallel and therefore does not introduce lag time.

In one embodiment, the adjacent even (or adjacent odd) columns may be used to form a differential memory unit so that the memory cell 100 and the complementary memory cell 100# are separated by another memory cell, which could be part of the next differential memory pair. Thus, an interlaced design may be used.

Figure 5:
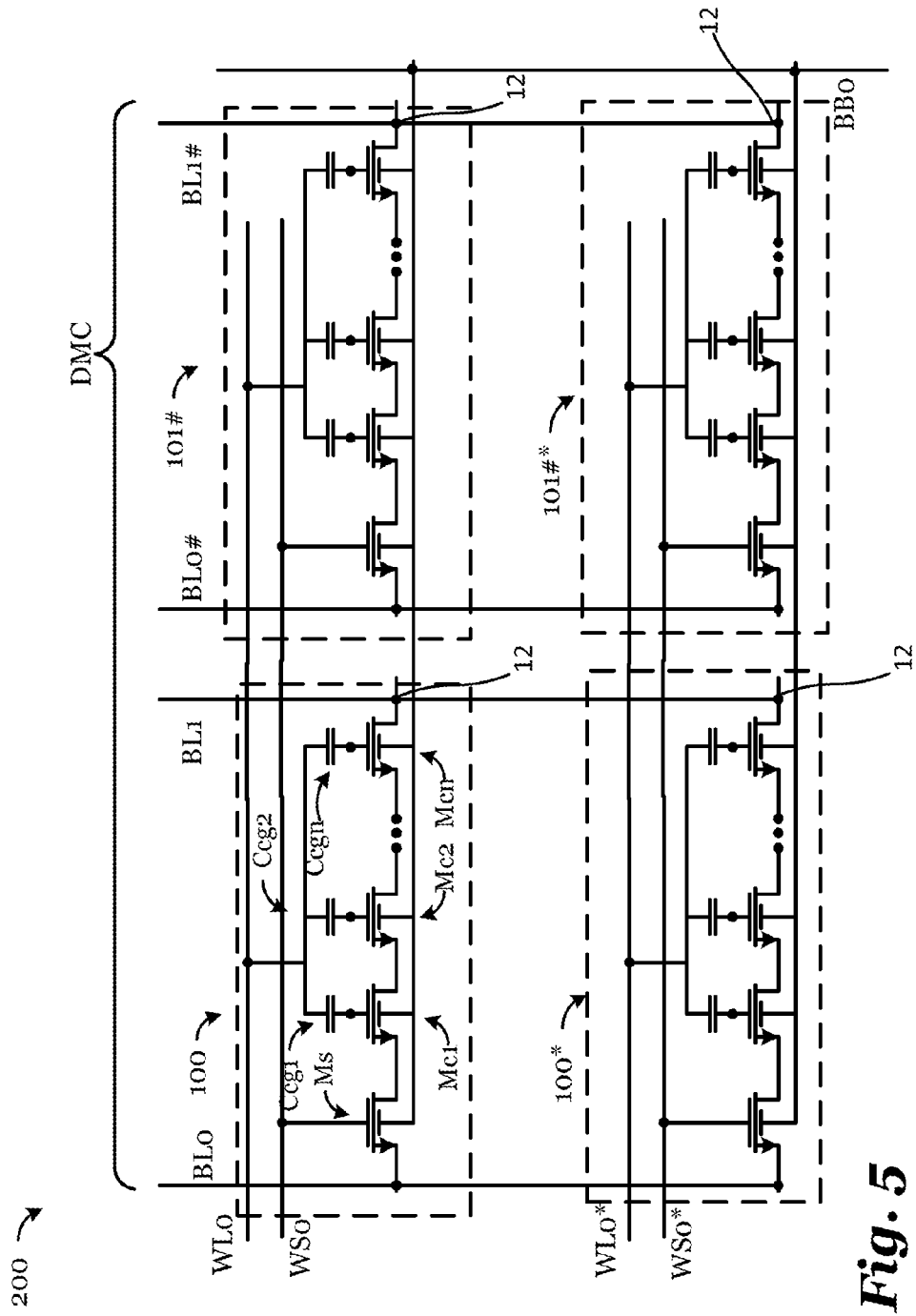
FIG. 5 illustrates an alternative embodiment of implementing additional redundancy in accordance with embodiments of the present invention.

FIG. 5 illustrates an alternative embodiment of implementing additional redundancy in accordance with embodiments of the present invention.

FIG. 5 may be a specific embodiment of FIG. 4A and illustrates that each storage unit (of FIG. 4A) is a memory cell 100 comprising a select transistor Ms and a plurality of floating gate storage transistors (Mc1, Mc2, . . . , Mcn) and storage capacitors such as a first capacitor Ccg1, a second capacitor Ccg2, . . . , and a nth capacitor Ccgn. The memory cell 100 described previously in FIG. 1A is used in the different pair and is therefore not repeated again. Similarly, the memory cells in the differential pairs in this embodiment may be implemented, e.g., using embodiments described in FIGS. 2A-2D and therefore not repeated again. As described previously, each differential pair comprises four memory units: a memory cell 100, a duplicate memory cell 100*, a complementary memory cell 100# and a duplicate complementary memory cell 100#*. The memory cell 100 and the duplicate memory cell 100* store the same value while the complementary memory cell 100# and the duplicate complementary memory cell 100#* store the same value but opposite in phase with the memory cell 100 and the duplicate memory cell 100*.

The memory cell 100 and the duplicate memory cell 100* may be programmed and erased simultaneously by biasing at the same time. Similarly, the complementary memory cell 100#, and the duplicate complementary memory cell 100#* may be programmed and erased simultaneously by biasing at the same time.

All the storage units are identically biased during a read operation. Thus, the first bit line BL1 includes current flowing through the drain node 12 of the memory cell 100 and the duplicate memory cell 100*. Correspondingly, the first complementary bit line BL# includes current flowing through the drain node 12 of the complementary memory cell 100# and the duplicate complementary memory cell 100#*. The two currents can be compared to determine the value of the bit stored in the differential memory cell DMC.

In one or more embodiments, the number of floating gate storage transistors is two, i.e., n=2, so that differential memory cell DMC comprises eight floating gate storage transistors and four select transistors. In one or more embodiments, the first bit line BL0 and the first complementary bit line BL0# may be the same such that the cell is symmetric around this bit line (e.g., as shown in FIG. 3D).

Figure 6:
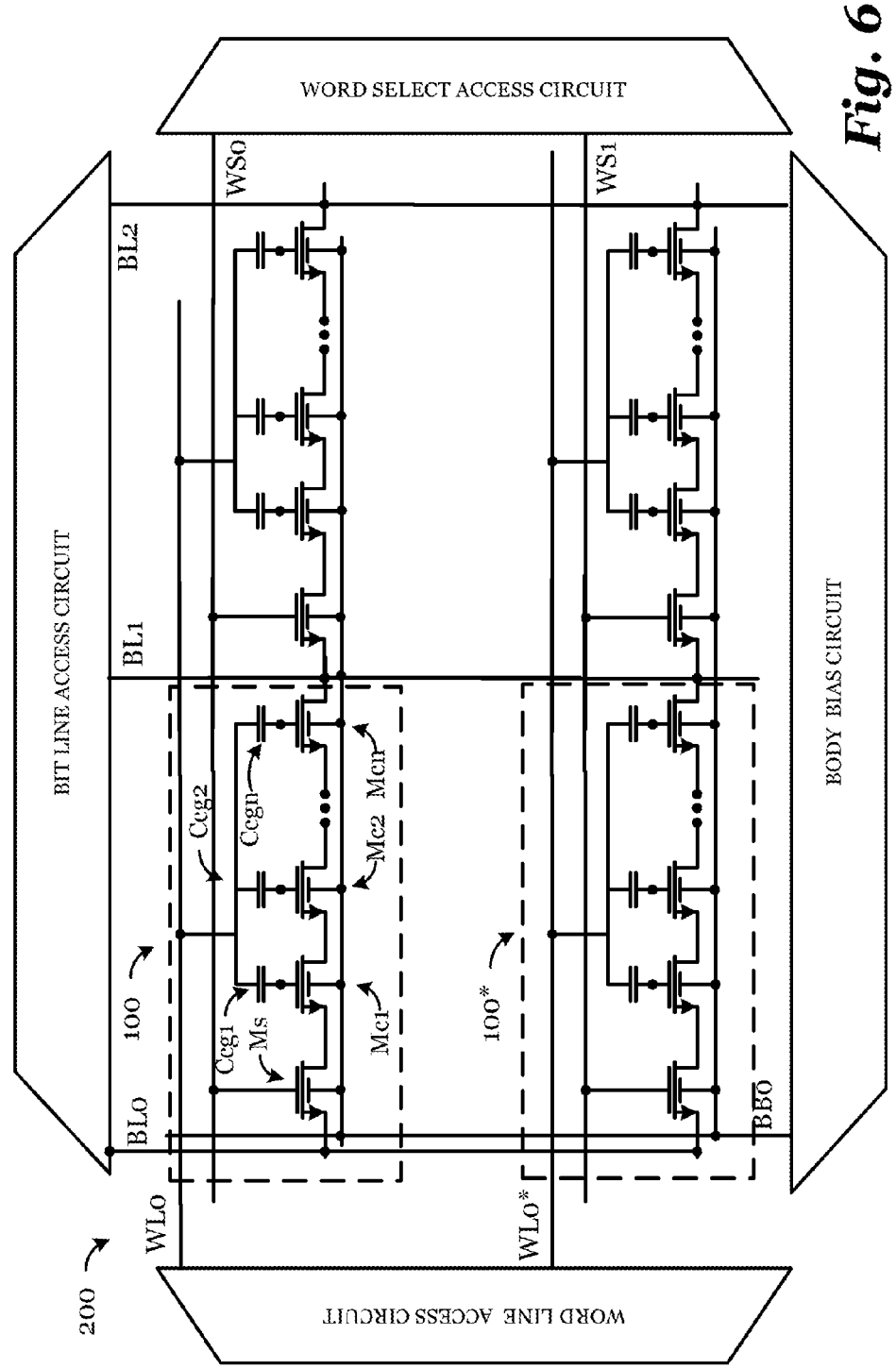
FIG. 6 illustrates a schematic of a memory cell array comprising a storage unit having a plurality of storage cells and one select transistor and adding redundancy in accordance with embodiments of the present invention.

FIG. 6 illustrates a schematic of a memory cell array comprising a storage unit having a plurality of storage cells and one select transistor in accordance with embodiments of the present invention.

Unlike the prior embodiment of FIG. 4 or FIG. 5, a differential pair is not added while still increasing redundancy. The memory cell 100 described previously in FIG. 1A is used in this embodiment and is therefore not repeated again. Similarly, the memory cells in this embodiment may be implemented, e.g., using embodiments described in FIGS. 2A-2D and therefore not repeated again. In this embodiment, a memory cell 100 and a duplicate memory cell 100* store identical values. For example, both cells are programmed, erased, and read simultaneously. In various embodiments, the memory cell 100 and the duplicate memory cell 100* may be in adjacent rows or separated further. However, they may be in the same column so that the same bit line addresses both cells.

This embodiment protects both programmed and erased modes, i.e., values "0" and "1" from soft bit error. For example, after a program operation, all the storage nodes in both the memory cell 100 and the duplicate memory cell 100* are programmed to include additional electrons increasing the threshold voltage of the storage transistors. Even if one of the transistor loses its charge due to an error, the remaining transistors would continue to maintain charge and therefore the current conduction from the source node 11 to the drain node 12 is similar to the current from the programmed mode. In contrast, after an erase operation, all the storage nodes in both the memory cell 100 and the duplicate memory cell 100* do not have any charge and the storage transistors have a lower threshold voltage. Accordingly, after this erase mode, a source to drain on current flows through each of the storage transistors. For example, if one of the transistor in the memory cell 100 gains charge, then the on current flowing out into the first bit line BL1 from the memory cell 100 is cut off. However, the duplicate memory cell 100* continues to provide a source to drain ON current, which would result in identifying the correct value of the stored bit.

Figure 7:
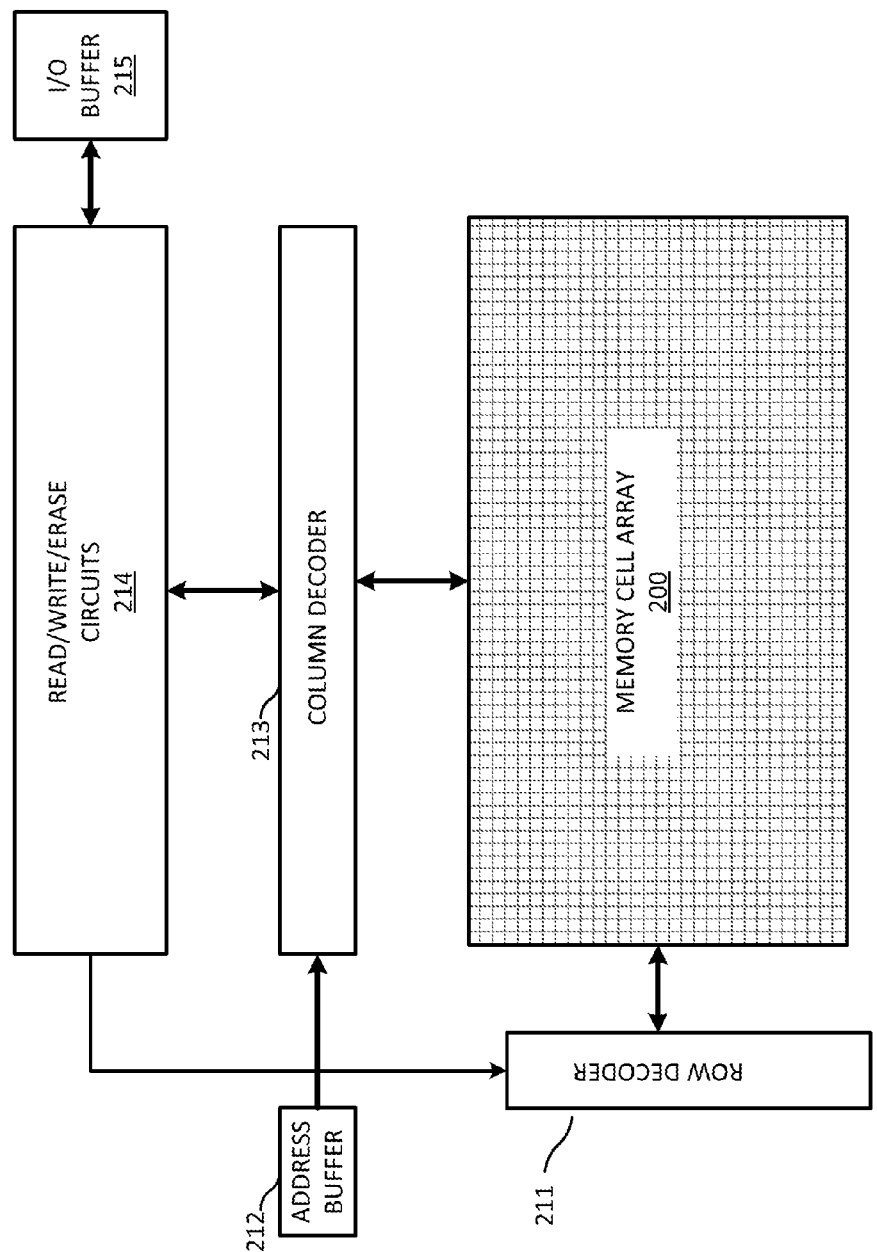
FIG. 7 is a schematic of a memory in accordance with embodiments of the present invention.

FIG. 7 is a schematic of a memory in accordance with embodiments of the present invention.

The memory illustrated may be formed using various embodiments described above. As described in detail, each memory cell may be read and programmed individually or erase together if needed. Typically, the memory simultaneously reads and programs a word that is stored into a corresponding page of memory cells in a same row of the memory cell array 200 (for example, 8 memory cells for a word of 8 bits). Conversely, the memory cells are erased at the level of sectors—for example, each sector consisting of a row of memory cells.

An address buffer 212 receives an address of a selected page in the memory cell array 200 (for a corresponding word). For example, a portion of the address is provided to a row decoder 211, which selects the row of the selected page in the memory cell array 200. The other portion of the address is instead supplied to a column decoder 213, which selects a column in the memory cell array 200 within each packet of columns associated with a corresponding i-th bit of all the words. The address buffer 212 is also used to select a sector that is to be erased (through the row decoder 211).

Read/write/erase circuits 214 controls operation of the row decoder 211 and the column decoder 213. In various embodiments, the read/write/erase circuits 214 include the various access circuits described previously in various embodiments. Additionally, the read/write/erase circuits 214 also include all the components (such as a power management unit with charge pumps, sense amplifiers, comparators, reference cells, pulse generators, and the like) that are used for writing (i.e., programming or erasing) the memory cells and for reading their logic values. The read/write/erase circuits 214 are also coupled with an input/output (I/O) buffer 215. The input/output buffer 215 receives a word to be written into the selected page of the memory matrix 105. Alternatively, the input/output buffer 215 provides a word that has been read from the selected page of the memory cell array 200 (e.g., through the column decoder 213).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1A-1D, 2A-2D, 3A-3D, 4A-4B, 5-7 may be combined with each other. It is therefore intended that the appended claims encompass any such modifications or embodiments.

What is claimed is:

1. A non-volatile memory cell for storing a single bit, the non-volatile memory cell comprising:

an access transistor comprising a gate, a first body, a first source/drain node, and a second source/drain node;
a first floating gate storage transistor comprising a third source/drain node, a second body, a fourth source/drain node, and a first floating gate comprising a first storage node, wherein the third source/drain node is coupled to the second source/drain node;
a first capacitor comprising a first plate coupled to the first storage node and having an opposite second plate;
a second floating gate storage transistor comprising a fifth source/drain node, a third body, a sixth source/drain node, a second floating gate comprising a second storage node, wherein the fifth source/drain node is coupled to the fourth source/drain node; and
a second capacitor comprising a third plate coupled to the second storage node and having an opposite fourth plate, wherein the second plate is coupled to the fourth plate, wherein the first body of the access transistor is coupled to the second body and the third body.

2. The memory cell of claim 1, further comprising:
a third floating gate storage transistor comprising a seventh source/drain node, a fourth body, an eighth source/drain node, a third floating gate comprising a third storage node, wherein the seventh source/drain node is coupled to the sixth source/drain node; and
a third capacitor comprising a fifth plate coupled to the third storage node and having an opposite sixth plate, wherein the sixth plate is coupled to the fourth plate, wherein the fourth body is coupled to the second body and the third body.

3. The memory cell of claim 1, wherein each of the access transistor, the first floating gate storage transistor, and the second floating gate storage transistor comprise an n-channel transistor.

4. The memory cell of claim 1, wherein the first floating gate storage transistor and the second floating gate storage transistor are configured to be programmed simultaneously by electrons tunnel flow from the second body into the first floating gate and third body into the second floating gate.

5. The memory cell of claim 1, wherein the first floating gate storage transistor and the second floating gate storage transistor are configured to be erased simultaneously by electrons that tunnel from the first floating gate into the second body and the second floating gate into the third body.

6. The memory cell of claim 1, further comprising:
a first bit line node coupled to the first source/drain node;
a second bit line node coupled to the sixth source/drain node;
a word line node coupled to the second plate and the fourth plate; and
an access control line node coupled to the gate of the access transistor.

7. The memory cell of claim 1, further comprising:
a reference line node coupled to the first source/drain node;
a bit line node coupled to the sixth source/drain node;
a word line node coupled to the second plate and the fourth plate; and
an access control line node coupled to the gate of the access transistor.

8. The memory cell of claim 1, further comprising:
a first well region having a first doping type, wherein the first floating gate storage transistor, the second floating gate storage transistor, the first capacitor, and the second capacitor are formed over the first well region;
a second well region having a second doping type disposed within the first well region, the second doping type being opposite to the first doping type, the first floating gate transistor and the second floating gate transistor being formed within and over the second well region; and
a third well region having the second doping type disposed within the second well region, the first capacitor and the second capacitor being formed within and over the third well region.

9. The memory cell of claim 1, wherein the gate of the access transistor, the first floating gate, the second floating gate, the first plate, and the third plate are formed from a single polysilicon layer.

10. A memory cell array comprising:
a plurality of sectors arranged in rows, wherein each sector comprises columns of differential memory cells, wherein each of the differential memory cells comprise a storage cell and a complementary storage cell,
wherein the storage cell is configured to be read through a bit line, wherein the storage cell comprises a first storage unit comprising a first storage node and a second storage unit comprising a second storage node, wherein the first storage unit is coupled in series with the second storage unit and coupled to the bit line, wherein the first storage node and the second storage node are configured to store the same value; and
wherein the complementary storage cell is configured to be read through a complementary bit line, wherein the complementary storage cell comprises a first complementary storage unit comprising a third storage node and a second complementary storage unit comprising a fourth storage node, wherein the first complementary storage unit is coupled in series with the second complementary storage unit and coupled to the complementary bit line, wherein the first complementary storage unit and the second complementary storage unit are configured to store the same value that is opposite in phase to the value stored in the first and the second storage units.

11. The memory cell array of claim 10, wherein the storage cell further is a first select transistor, wherein the first storage unit is a first floating gate storage transistor, wherein the second storage unit is a second floating gate storage transistor, wherein the complementary storage cell is a second select transistor, wherein the first complementary storage unit is a third floating gate storage transistor, wherein the second complementary storage unit is a fourth floating gate storage transistor.

12. The memory cell array of claim 11, wherein the storage cell further comprises a fifth floating gate storage transistor and the complementary storage cell further comprises a sixth floating gate storage transistor.

13. The memory cell array of claim 10, further comprising:
read circuits for reading a bit stored on each of the differential memory cells;
programming circuits for programming a bit into each of the differential memory cells; and
erase circuits for erasing a bit from each of the differential memory cells.

14. The memory cell array of claim 10, further comprising a sense circuit configured to:
compare a first current flowing through the bit line from the first storage cell with a second current flowing through the complementary bit line from the complementary storage cell during a read operation; and determining the value of the bit stored in the differential memory cell.

15. A memory cell array comprising:
a plurality of sectors arranged in rows, wherein each sector comprises columns of differential memory cells, wherein each of the differential memory cells comprise a first storage cell in a first sector, a first complementary storage cell in the first sector, a second storage cell in a second sector, and a second complementary storage cell in the second sector,
wherein the first storage cell and the second storage cell are configured to be read simultaneously through a bit line, wherein the first storage cell comprises a first storage unit comprising a first storage node, wherein the second storage cell comprises a second storage unit comprising a second storage node, wherein the first storage node and the second storage node are configured to store the same value; and
wherein the first complementary storage cell and the second complementary storage cell are configured to be read simultaneously through a complementary bit line, wherein the first complementary storage cell comprises a first complementary storage unit comprising a third storage node, wherein the second complementary storage cell comprises a second complementary storage unit comprising a fourth storage node, wherein the first complementary storage unit and the second complementary storage unit are configured to store the same value that is opposite in phase to the value stored in the first and the second storage units.

16. The memory cell array of claim 15, wherein the first sector is separated from the second sector by another sector.

17. The memory cell array of claim 15, wherein the first storage cell is separated from the first complementary storage cell along the sector by another storage cell.

18. The memory cell array of claim 15, wherein the first storage cell further comprises another first storage unit comprising another first storage node, wherein the second storage cell further comprises another second storage unit comprising another second storage node, wherein the first storage node, the another first storage node along with the second storage node and the another second storage node are configured to store the same value, wherein the first complementary storage cell further comprises another first complementary storage unit comprising another third storage node, wherein the second complementary storage cell further comprises another second complementary storage unit comprising another fourth storage node, wherein the third storage node, the another third storage node along with the fourth storage node and the another fourth storage node are configured to store the same value.

19. The memory cell array of claim 15, further comprising a programming circuit configured to program the same value into the first storage node and the second storage node, and program a complementary value into the first storage node and the second storage node, the complementary value being opposite in phase to the value programmed into the third storage node and the fourth storage node.

20. The memory cell array of claim 15, further comprising a sense circuit configured to:
compare a first current flowing through the bit line from the first storage cell and the second storage cell with a second current flowing through the complementary bit line from the first complementary storage cell and the second complementary storage cell during a read operation; and
determining the value of the bit stored in the differential memory cell.

21. A memory cell array comprising:
a first line;
a second line;
a first access control line;
a first word line;
a body line;
a first non-volatile memory cell storing a first single bit, the first non-volatile memory cell comprising:
a first access transistor comprising a gate coupled to the first access control line, a body coupled to the body line, a first source/drain node coupled to the first line, and a second source/drain node; and
a first plurality of storage transistors in series, wherein each of the first plurality of storage transistors comprise a floating gate capacitively coupled to the first word line, wherein a first end of the first plurality of storage transistors is coupled to the second source/drain node of the first access transistor, and wherein a second end of the first plurality of storage transistors is coupled to the second line.

22. The memory array of claim 21, further comprising:
a second access control line;
a third line;
a second non-volatile memory cell storing a second single bit, the second non-volatile memory cell comprising:
a second access transistor comprising a gate coupled to the second access control line, a body coupled to the body line, a first source/drain node coupled to the second line, and a second source/drain node; and
a second plurality of storage transistors in series, wherein each of the second plurality of storage transistors comprise a floating gate capacitively coupled to the first word line, wherein a first end of the second plurality of storage transistors is coupled to the second source/drain node of the second access transistor, and wherein a second end of the second plurality of storage transistors is coupled to the third line.

23. The memory array of claim 21, further comprising:
a first complementary line and a second complementary line;
a second non-volatile memory cell storing a complementary value of the first single bit, the first non-volatile memory cell and the second non-volatile memory cell forming part of a differential memory cell, the second non-volatile memory cell comprising:
a second access transistor comprising a gate coupled to the first access control line, a body coupled to the body line, a first source/drain node coupled to the first complementary line, and a second source/drain node; and
a second plurality of storage transistors in series, wherein each of the second plurality of storage transistors comprise a floating gate capacitively coupled to the first word line, wherein a first end of the second plurality of storage transistors is coupled to the second source/drain node of the second access transistor, and wherein a second end of the second plurality of storage transistors is coupled to the second complementary line.

24. The memory array of claim 23, further comprising:
a second access control line;
a second word line;
a third non-volatile memory cell storing the first single bit, the third non-volatile memory cell comprising:

a third access transistor comprising a gate coupled to the second access control line, a body coupled to the body line, a first source/drain node coupled to the first line, and a second source/drain node; and a third plurality of storage transistors in series, wherein each of the third plurality of storage transistors comprise a floating gate capacitively coupled to the second word line, wherein a first end of the third plurality of storage transistors is coupled to the second source/drain node of the third access transistor, and wherein a second end of the first plurality of storage transistors is coupled to the second line;

a fourth non-volatile memory cell storing the complementary value of the first single bit, the third non-volatile memory cell and the fourth non-volatile memory cell forming part of the differential memory cell, the fourth non-volatile memory cell comprising:

a fourth access transistor comprising a gate coupled to the second access control line, a body coupled to the body line, a first source/drain node coupled to the first complementary line, and a second source/drain node; and a fourth plurality of storage transistors in series, wherein each of the second plurality of storage transistors comprise a floating gate capacitively coupled to the second word line, wherein a first end of the second plurality of storage transistors is coupled to the second source/drain node of the second access transistor, and wherein a second end of the second plurality of storage transistors is coupled to the second complementary line.

25. The memory array of claim 21, further comprising:
a third line;
a second non-volatile memory cell storing a complementary value of the first single bit, the first non-volatile memory cell and the second non-volatile memory cell forming part of a differential memory cell, the second non-volatile memory cell comprising:
a second access transistor comprising a gate coupled to the first access control line, a body coupled to the body line, a first source/drain node coupled to the first line, and a second source/drain node; and a second plurality of storage transistors in series, wherein each of the second plurality of storage transistors comprise a floating gate, wherein a first end of the second plurality of storage transistors is coupled to the second source/drain node of the second access transistor, and wherein a second end of the second plurality of storage transistors is coupled to the third line.

26. The memory array of claim 21, further comprising:
a second access control line;
a second word line;
a second non-volatile memory cell storing the first single bit, the second non-volatile memory cell comprising:
a second access transistor comprising a gate coupled to the second access control line, a body coupled to the body line, a first source/drain node coupled to the first line, and a second source/drain node; and a second plurality of storage transistors in series, wherein each of the second plurality of storage transistors comprise a floating gate capacitively coupled to the second word line, wherein a first end of the second plurality of storage transistors is coupled to the second source/drain node of the second access transistor, and wherein a second end of the first plurality of storage transistors is coupled to the second line.

27. The memory array of claim 21, further comprising:
a programming circuit for simultaneously programming the first plurality of storage transistors;
an erase circuit for simultaneously erasing the first plurality of storage transistors; and
a read circuit for reading the single bit stored in the first plurality of storage transistors.

28. The memory array of claim 27, wherein each of the plurality of storage transistors comprises a body coupled to the body line, wherein the programming circuit causes electrons to flow from the body of each of the plurality of storage transistors into the floating gate.

29. The memory array of claim 21, wherein the first line is a reference line and the second line is a bit line.

30. The memory array of claim 21, wherein the first line is a first bit line and the second line is a second bit line.

* * * * *